(12) United States Patent
Ramaswamy

(10) Patent No.: US 10,014,305 B2
(45) Date of Patent: Jul. 3, 2018

(54) METHODS OF FORMING AN ARRAY COMPRISING PAIRS OF VERTICALLY OPPOSED CAPACITORS AND ARRAYS COMPRISING PAIRS OF VERTICALLY OPPOSED CAPACITORS

(71) Applicant: Micron Technology, Inc., Boise, ID (US)

(72) Inventor: Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/340,838

(22) Filed: Nov. 1, 2016

(65) Prior Publication Data

US 2018/0122817 A1    May 3, 2018

(51) Int. Cl.
    *H01L 27/11507* (2017.01)
    *H01L 49/02* (2006.01)

(52) U.S. Cl.
    CPC ........ *H01L 27/11507* (2013.01); *H01L 28/60* (2013.01)

(58) Field of Classification Search
    CPC ..................... H01L 27/11507; H01L 28/60
    See application file for complete search history.

(56) References Cited

U.S. PATENT DOCUMENTS

| | | | |
|---|---|---|---|
| 6,720,609 | B2 | 4/2004 | Deboer |
| 6,849,895 | B2 | 2/2005 | Osabe et al. |
| 8,022,457 | B2 | 9/2011 | Seo et al. |
| 9,324,730 | B2 | 4/2016 | Nam |
| 9,460,958 | B2 | 10/2016 | Purayath et al. |

(Continued)

FOREIGN PATENT DOCUMENTS

| | | |
|---|---|---|
| KR | 2002-0046139 | 6/2002 |
| KR | 2007-0052653 | 5/2007 |

(Continued)

OTHER PUBLICATIONS

U.S. Appl. No. 15/340,838, filed Nov. 1, 2016, Ramaswamy.

(Continued)

*Primary Examiner* — Mohammad Choudhry
(74) *Attorney, Agent, or Firm* — Wells St. John P.S.

(57) ABSTRACT

A method of forming an array comprising pairs of vertically opposed capacitors comprises forming a conductive lining in individual capacitor openings in insulative-comprising material. An elevational mid-portion of individual of the conductive linings is removed to form an upper capacitor electrode lining and a lower capacitor electrode lining that are elevationally separate and spaced from one another in the individual capacitor openings. A capacitor insulator is formed laterally inward of the upper and lower capacitor electrode linings in the individual capacitor openings. Conductive material is formed laterally inward of the capacitor insulator in the individual capacitor openings and elevationally between the capacitor electrode linings. The conductive material is formed to comprise a shared capacitor electrode that is shared by vertically opposed capacitors in individual of the pairs of vertically opposed capacitors. Additional methods and structure independent of method are disclosed.

28 Claims, 27 Drawing Sheets

(56) References Cited

U.S. PATENT DOCUMENTS

| | | |
|---|---|---|
| 9,613,981 B2 | 4/2017 | Huo |
| 2002/0195639 A1 | 12/2002 | Deboer et al. |
| 2004/0015643 A1 | 1/2004 | Torrisi et al. |
| 2004/0164313 A1 | 8/2004 | Tews |
| 2004/0180547 A1 | 9/2004 | Beintner |
| 2006/0043450 A1* | 3/2006 | Tang ................ H01L 21/28132 257/302 |
| 2006/0110884 A1 | 5/2006 | Wang |
| 2007/0057301 A1 | 3/2007 | Wang |
| 2011/0018098 A1 | 2/2011 | Plum |
| 2012/0104491 A1 | 5/2012 | Heineck et al. |
| 2012/0214285 A1 | 8/2012 | Guha et al. |
| 2012/0248504 A1 | 10/2012 | Liu |
| 2013/0049110 A1 | 2/2013 | Wang et al. |
| 2013/0235642 A1 | 9/2013 | Heineck et al. |
| 2014/0054677 A1 | 2/2014 | Hu et al. |
| 2014/0054678 A1 | 2/2014 | Hu et al. |
| 2014/0054718 A1 | 2/2014 | Karda et al. |
| 2014/0231914 A1 | 8/2014 | Chang |
| 2015/0041873 A1 | 2/2015 | Karda et al. |
| 2015/0140781 A1 | 5/2015 | Karda et al. |
| 2015/0200202 A1 | 7/2015 | Karda et al. |
| 2015/0318285 A1 | 11/2015 | Zhang |
| 2015/0318296 A1 | 11/2015 | Kim |
| 2016/0204122 A1 | 7/2016 | Shoji |
| 2016/0276365 A1 | 9/2016 | Choi |
| 2017/0025604 A1 | 1/2017 | Sills et al. |

FOREIGN PATENT DOCUMENTS

| | | |
|---|---|---|
| KR | 2013-0135729 | 12/2013 |
| WO | PCT/US2017/056203 | 1/2018 |
| WO | PCT/US2017/056477 | 1/2018 |

OTHER PUBLICATIONS

U.S. Appl. No. 15/340,842, filed Nov. 1, 2016, Ramaswamy.
U.S. Appl. No. 15/401,372, filed Jan. 9, 2017, Ramaswamy.
U.S. Appl. No. 15/402,463, filed Jan. 10, 2017, Ramaswamy.
U.S. Appl. No. 15/402,679, filed Jan. 10, 2017, Chavan et al.
U.S. Appl. No. 15/404,995, filed Jan. 12, 2017, Sils et al.

* cited by examiner

METHODS OF FORMING AN ARRAY COMPRISING PAIRS OF VERTICALLY OPPOSED CAPACITORS AND ARRAYS COMPRISING PAIRS OF VERTICALLY OPPOSED CAPACITORS

TECHNICAL FIELD

Embodiments disclosed herein pertain to methods of forming an array comprising pairs of vertically opposed capacitors and to arrays comprising pairs of vertically opposed capacitors.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulator material. Ferroelectric materials are characterized by having two stable polarized states and thereby can comprise programmable material of a capacitor and/or memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. One type of memory cell has a select device electrically coupled in series with a ferroelectric capacitor.

Other programmable materials may be used as a capacitor insulator to render capacitors non-volatile. Further and regardless, arrays of capacitors may be formed as part of an array of memory cells or an array in other integrated circuitry.

DETAILED DESCRIPTION OF EXAMPLE EMBODIMENTS

Embodiments of the invention encompass methods of forming an array comprising pairs of vertically opposed capacitors and also such arrays independent of method of manufacture. Example embodiments of methods of forming such arrays are initially described with reference to FIGS. 1-17.

Figure 1:
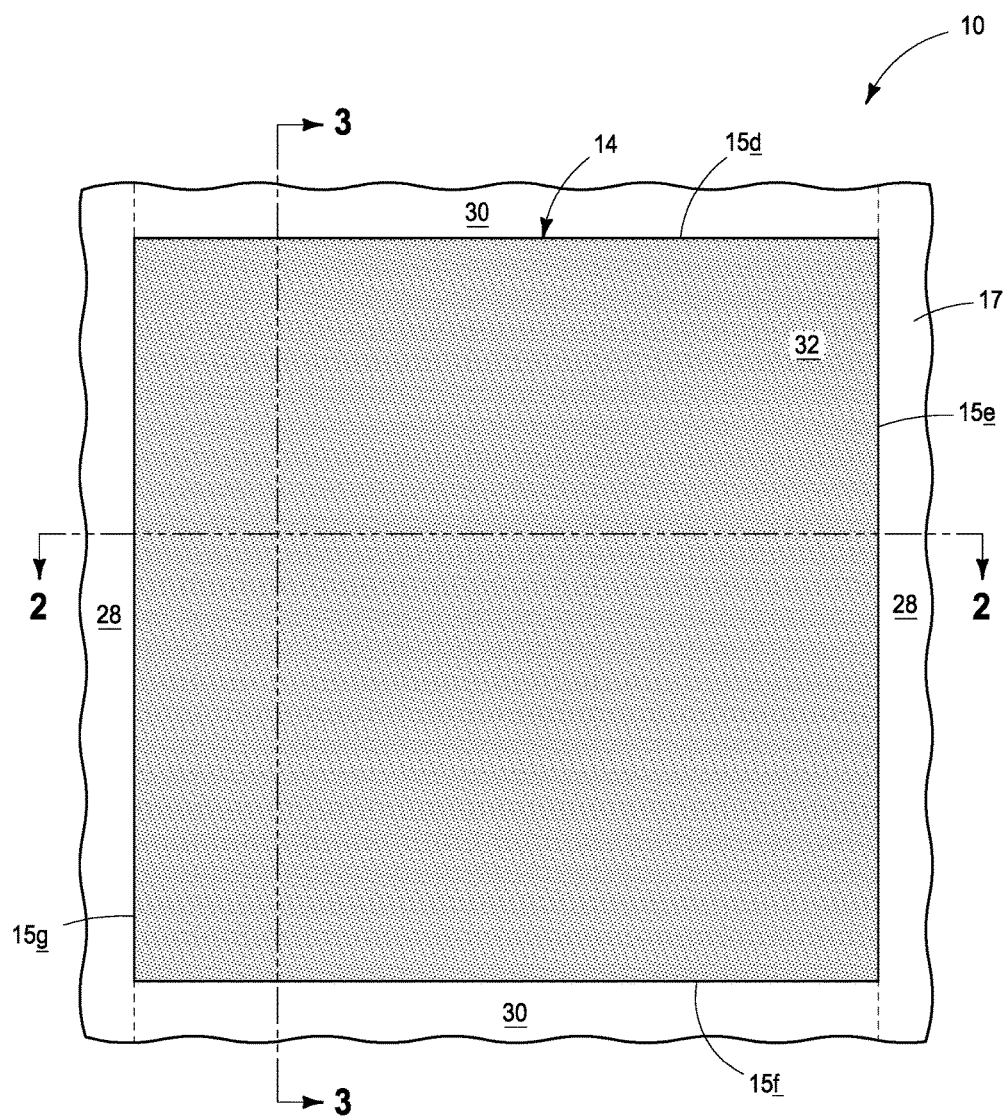
FIG. 1 is a diagrammatic cross-sectional view of a substrate construction in process in accordance with an embodiment of the invention, and is taken through line 1-1 in FIGS. 2 and 3.
Figure 2:
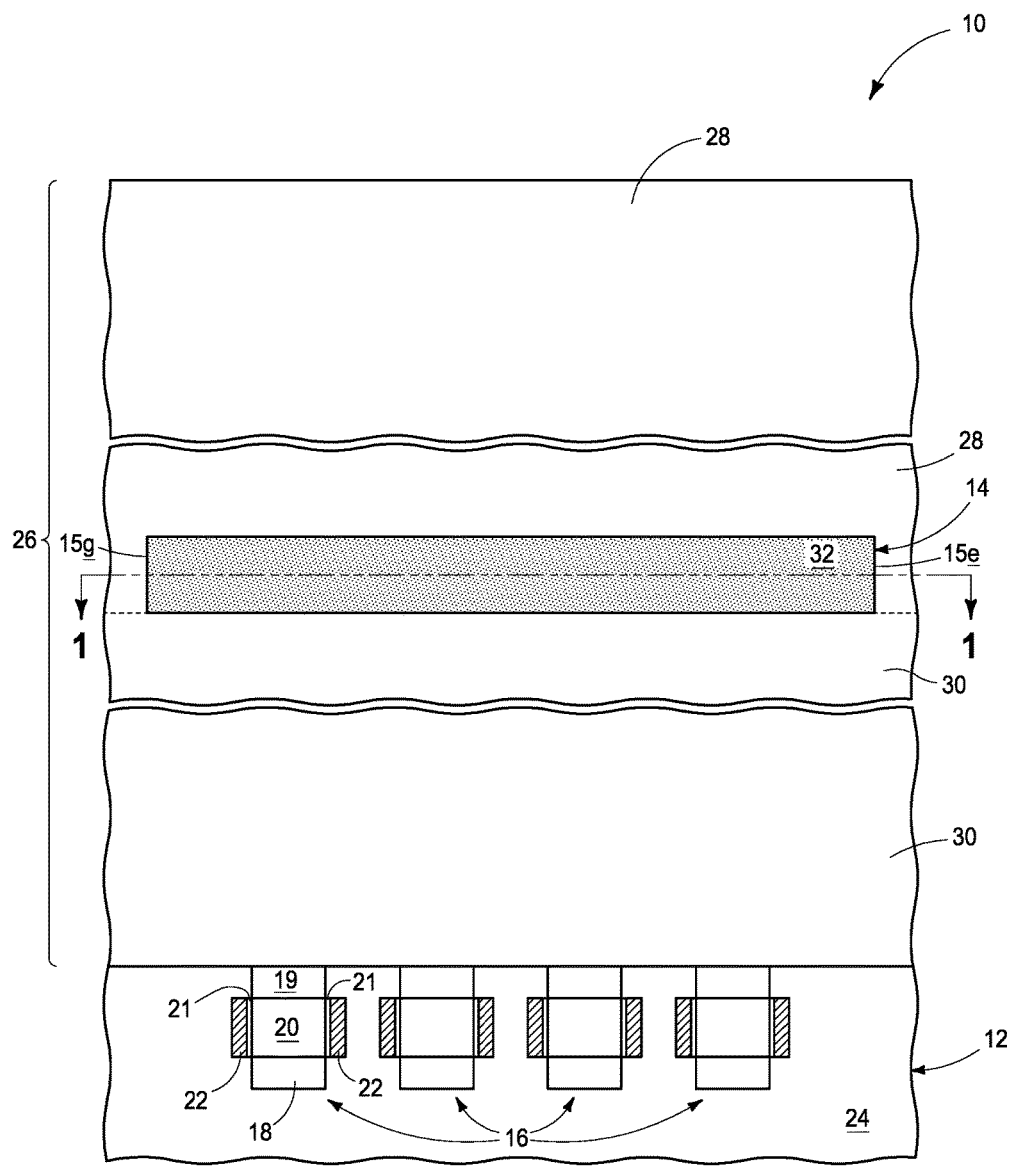
FIG. 2 is a cross-sectional view taken through line 2-2 in FIG. 1.
Figure 3:
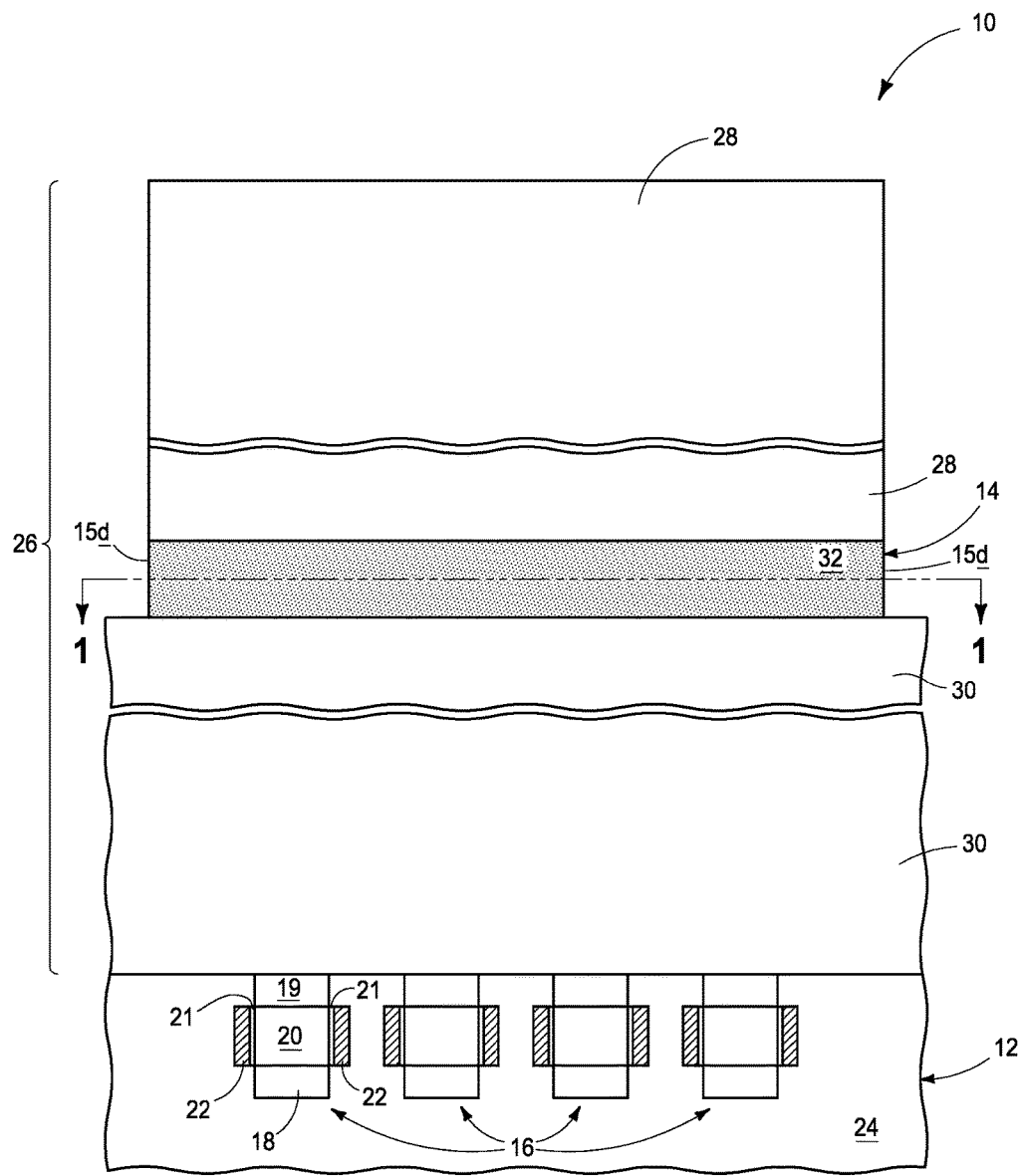
FIG. 3 is a cross-sectional view taken through line 3-3 in FIG. 1.

Referring to FIGS. 1-3, such depict a portion of a substrate fragment or construction 10 comprising a base substrate 12 having an array or array area 14 within which pairs of vertically opposed capacitors will be fabricated. Area 17 (FIG. 1) is peripheral to array 14 and may be fabricated to include circuit components (i.e., circuitry). Base substrate 12 may include any one or more of conductive/conductor/ conducting (i.e., electrically herein), semiconductive, or insulative/insulator/insulating (i.e., electrically herein) materials. Various materials are shown above base substrate 12. Materials may be aside, elevationally inward, or elevationally outward of the depicted FIGS. 1-3 materials. For example, other partially or wholly fabricated components of integrated circuitry may be provided somewhere above, about, or within substrate 12 (e.g., transistors 16 being shown). Control and/or other peripheral circuitry for operating components within an array such as a memory array may also be fabricated, and may or may not be wholly or partially within an array or sub-array. Further, multiple sub-arrays may also be fabricated and operated independently, in tandem, or otherwise relative one another. As used in this document, a "sub-array" may also be considered as an array. Regardless, any of the materials, regions, and structures described herein may be homogenous or non-homogenous, and regardless may be continuous or discontinuous over any material which such overlie. Further, unless otherwise stated, each material may be formed using any suitable existing or yet-to-be-developed technique, with atomic layer deposition, chemical vapor deposition, physical vapor deposition, epitaxial growth, diffusion doping, and ion implanting being examples.

In one embodiment, transistors 16 in base substrate 12 extend elevationally (e.g., vertically) and individually comprise a lower source/drain region 18, an upper source/drain region 19, a channel region 20 elevationally there-between, and a conductive gate 22 operatively adjacent channel region 20, with a gate insulator 21 being between conductive gate 22 and channel region 20. In this document, unless otherwise indicated, "elevational(ly)", "higher", "upper", "lower", "top", "atop", "bottom", "above", "below", "under", "beneath", "up", and "down" are generally with reference to the vertical direction. Further, "vertical" and "horizontal" as used herein are directions that are perpendicular or within 10 degrees of perpendicular relative one another independent of orientation of the substrate in three-dimensional space. "Horizontal" refers to a general direction (i.e., within 10 degrees) along a primary substrate surface and may be relative to which the substrate is processed during fabrication. Also, "extend(ing) elevationally" and "elevationally-extending" in this document encompasses a range from vertical to no more than 45° from vertical. Further, "extend(ing) elevationally", "elevationally-extending", and "vertical(ly)" with respect to a field effect transistor are with reference to orientation of the transistor's channel length along which current flows in operation between two source/drain regions of the transistor that are at two different elevations. In some embodiments, transistors 16 are referred to as lower transistors as contrasted relative to other transistors that are referred to as upper transistors.

Transistors 16 may be provided for accessing and/or controlling capacitor devices to be fabricated in a lower tier there-over in memory or other circuitry, for example as will be apparent below. Gates 22 of transistors 16 may completely encircle (not shown) respective channels 20 or may only be over a portion of the circumference of channels 20, for example only over opposing sides of a channel 20. Regardless and depending on circuitry architecture, some or all of gates 22 may interconnect relative one another (not shown) along a line of such transistors. Only four transistors 16 are shown in FIGS. 2 and 3 for simplicity and clarity, although hundreds, thousands, millions, etc. would likely be formed within array 14. A material 24 is shown surrounding transistors 16 and may comprise, for example, semiconductor and/or insulator materials (e.g., monocrystalline silicon and doped or undoped silicon dioxide) not particularly germane to the invention.

Insulative-comprising material 26 has been formed over base substrate 12. Such may comprise, consist essentially of, or consist of insulative material. In one embodiment, insulative-comprising material 26 comprises an upper insulative material 28, a lower insulative material 30, and sacrificial material 32 elevationally there-between. In one embodiment, the sacrificial material is dielectric (e.g., silicon nitride) and in one embodiment is not dielectric (e.g., being semiconductive such as being predominantly elemental-form silicon that may or may not have conductivity modifying dopants therein, and/or being conductive material). Ideally in embodiments comprising sacrificial material 32, such is selectively etchable relative to upper insulative material 28 and lower insulative material 30. In this document, a selective etch or removal is an etch or removal where one material is removed relative to another stated material at a rate of at least 2.0:1. Insulative materials 28 and 30 may be compositionally the same or different relative one another, with doped or undoped silicon dioxide being two examples.

In one embodiment and as shown, sacrificial material 32 has been patterned to be of the same size and shape as the FIG. 1-depicted array area 14. An example manner of forming the construction of FIGS. 1-3 is to form lower insulative material 30 to have a planar uppermost surface, followed by deposition of sacrificial material 32 and upper insulative material there-over, and then patterning (e.g., by photolithography and etch with or without pitch multiplication) materials 28 and 32 together as shown. Array area 14 may be considered as comprising edges 15d, 15e, 15f, and 15g. Sacrificial material 32 may extend to at least one of these edges (e.g., edges 15d and 15f as shown) and be laterally exposed there to allow access of etching chemicals thereto as described below. Example thicknesses for each of insulative materials 28 and 30 is 3,500 to 6,000 Angstroms, and such need not be of the same thicknesses relative each other. An example thickness for sacrificial material 32 is 300 to 1,000 Angstroms. Wavy break lines are shown across materials 28 and 30 in FIGS. 2 and 3 to indicate, in one embodiment, their considerably greater thickness than that of sacrificial material 32.

In this document, "thickness" by itself (no preceding directional adjective) is defined as the mean straight-line distance through a given material or region perpendicularly from a closest surface of an immediately adjacent material of different composition or of an immediately adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Figure 4:
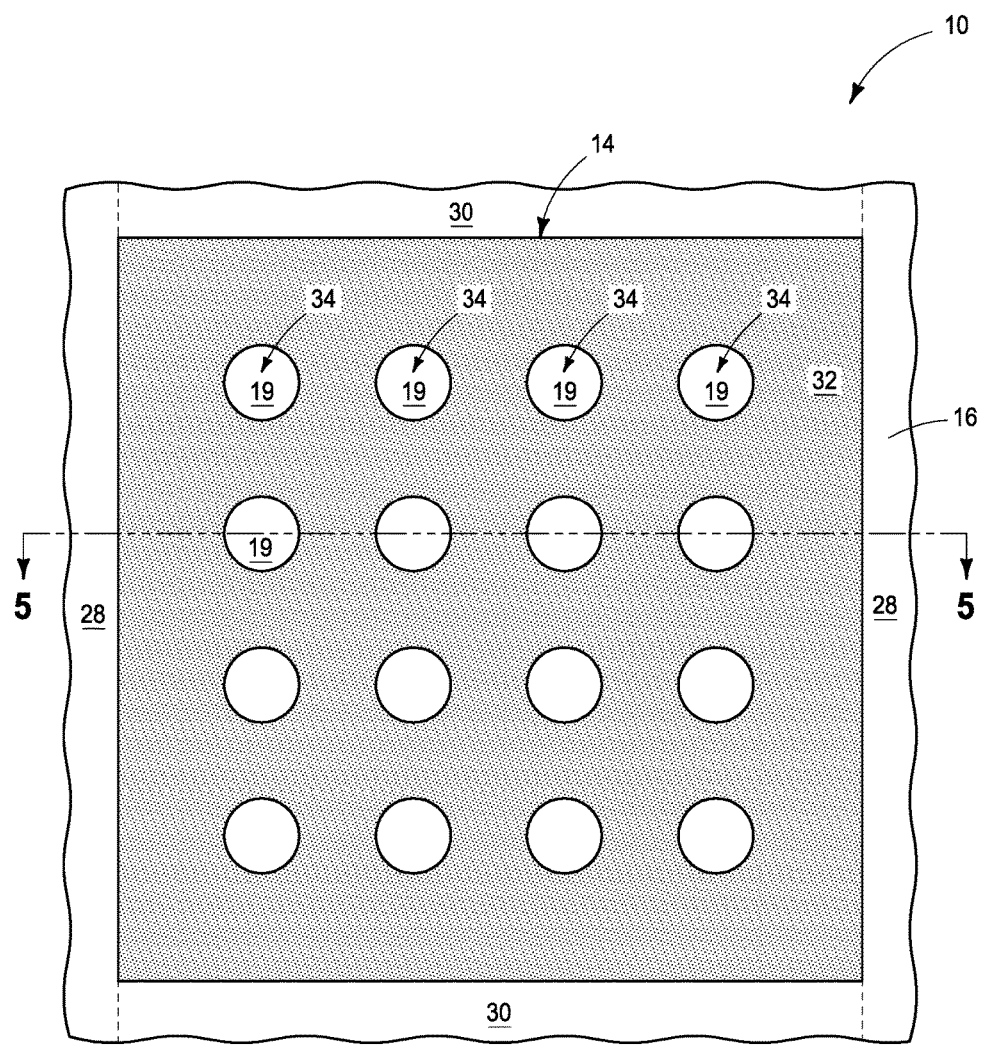
FIG. 4 is a view of the FIG. 1 construction at a processing step subsequent to that shown by FIG. 1, and is taken through line 4-4 in FIG. 5.
Figure 5:
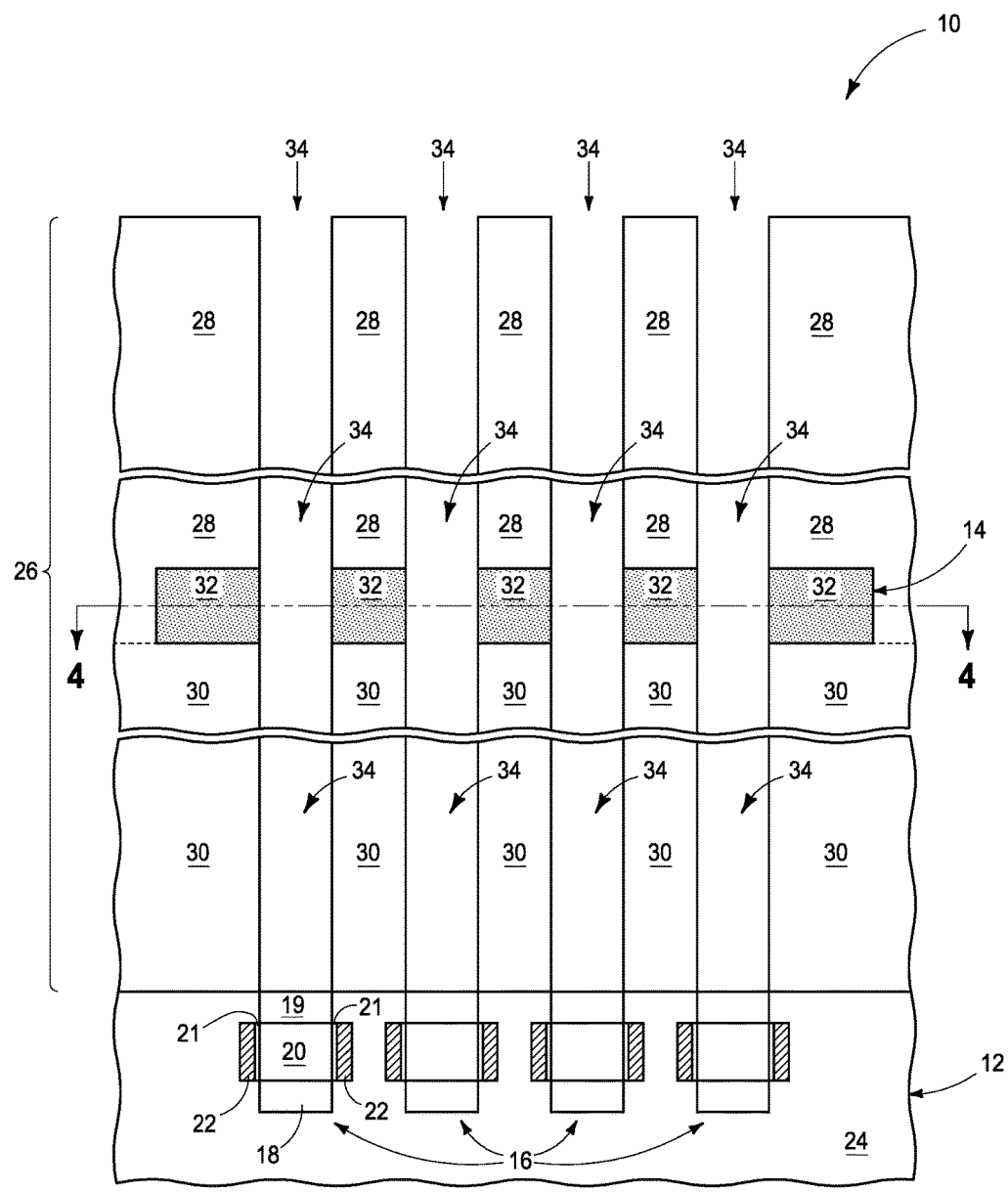
FIG. 5 is a cross-sectional view taken through line 5-5 in FIG. 4.

Referring to FIGS. 4 and 5, capacitor openings 34 having been formed in insulative-comprising material 26. For simplicity and clarity, array 14 is only shown as comprising sixteen capacitor openings 34, although again likely hundreds, thousands, millions, etc. would be formed within array 14. In one embodiment and as shown, individual capacitor openings 34 extend through upper insulative material 28, through sacrificial material 32, and into lower insulative material 30 ultimately to a node location (e.g., individual upper source/drain regions 19 of transistors 16). An example technique for forming capacitor openings 34 includes photolithographic patterning and etch with or without pitch multiplication. An etch stop layer (not shown) may be provided atop or as part of upper source/drain regions 19. When used, such may or may not be ultimately removed depending on whether it is conductive. An example anisotropic plasma chemistry for etching through silicon dioxide is a combination of $C_4F_6$, $C_4F_8$, and Ar, while that for etching through silicon nitride is a combination of $CH_2F_2$, $CF_4$, and $O_2$. Capacitor openings 34 may individually be of any one or more shapes in horizontal cross section, for example circular, ellipsoidal, 4-sided (e.g., square or rectangular), 6-sided, a combination of straight and curved sides, etc. Capacitor openings 34 are shown as having straight vertical sidewalls, although such may be non-vertical and/or not straight. An example maximum open dimension for individual capacitor openings 34 is 300 to 600 Angstroms.

Figure 6:
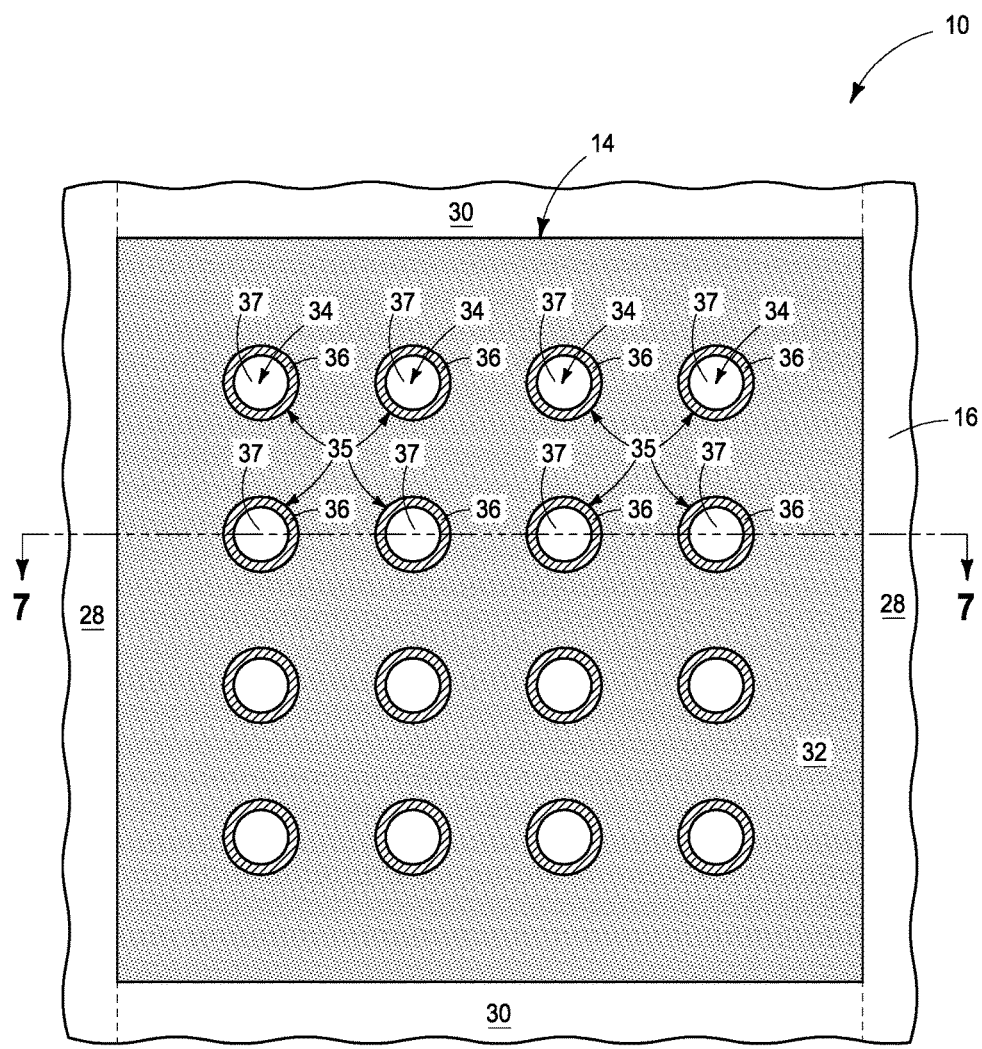
FIG. 6 is a view of the FIG. 4 construction at a processing step subsequent to that shown by FIG. 4, and is taken through line 6-6 in FIG. 7.
Figure 7:
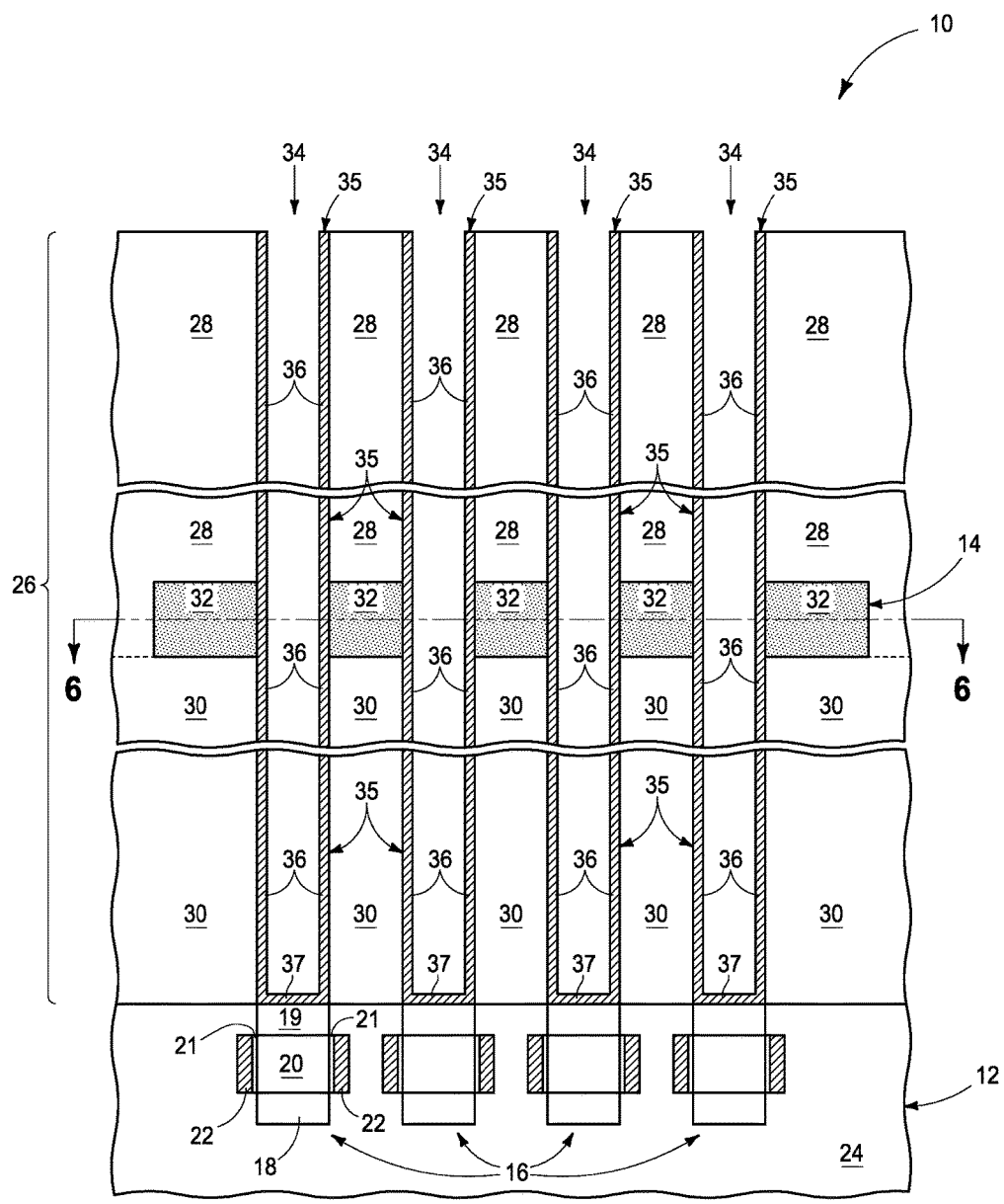
FIG. 7 is a cross-sectional view taken through line 7-7 in FIG. 6.

Referring to FIGS. 6 and 7, a conductive lining 35 has been formed in individual capacitor openings 34. Example conductive material for linings 35 are one or more of elemental metal, a mixture or alloy of two or more elemental metals, conductive metal compounds, and conductively-doped semiconductive materials, with TiN being one specific example. In one embodiment, conductive lining 34 is formed to be upwardly open. In one such embodiment and as shown, conductive linings 35 in individual capacitor openings 34 comprise a container shape comprising sidewalls 36 and a bottom 37 extending laterally to and between sidewalls 36. Alternately and by way of example only, upwardly-open conductive linings may individually comprise an upwardly and downwardly-open (not shown) conductive material cylinder (e.g., little or no bottom 37 extending between sidewalls 36). Conductive linings 35 extend to and electrically couple (in one embodiment directly electrically couple) to individual node locations (e.g., individual upper source/drain regions 19). In this document, regions/materials/components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions/materials/components. In contrast, when regions/materials/components are referred to as being "directly electrically coupled", no intervening electronic component (e.g., no diode, transistor, resistor, transducer, switch, fuse, etc.) is between the directly electrically coupled regions/materials/components. The node locations may or may not be electrically conductive at this point of processing. An example technique for forming conductive linings 35 is deposition of conductive material thereof to the depicted thickness, followed by planarizing such back at least to an uppermost outermost surface of upper insulative material 28. An example thickness for conductive linings 35 is 30 to 50 Angstroms.

Figure 8:
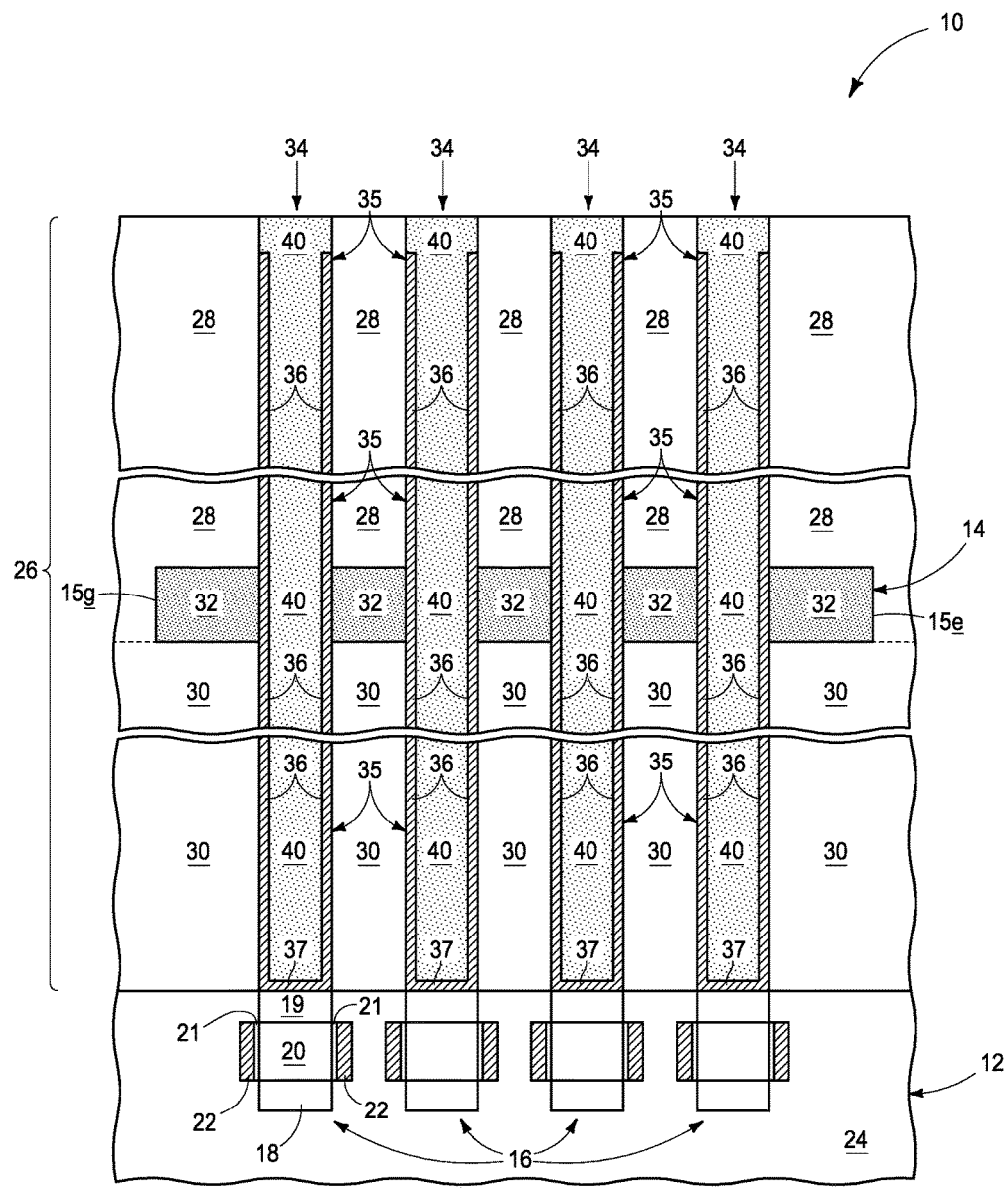
FIG. 8 is a view of the FIG. 7 construction at a processing step subsequent to that shown by FIG. 7.

Referring to FIG. 8 and in one embodiment, conductive linings 35 have been elevationally recessed relative to an uppermost surface of upper insulative material 28, for example by 50 to 75 Angstroms. An example technique for doing so is to fill the laterally central portions of conductive linings 35 with a sacrificial material (e.g., photoresist, and not shown) followed by a selective chemical etching of the material of conductive linings 35 relative to upper insulative material 28, and then followed by removal of the sacrificial material. FIG. 8 also shows in one embodiment the forming of covering material 40 over laterally-internal sidewalls of conductive linings 35 in individual capacitor openings 34, and after recessing of conductive linings 35. Covering material 40 covers at least a majority of those laterally-internal sidewalls of conductive linings 35 that are laterally over (e.g., laterally inward of) each of upper insulative material 28 and lower insulative material 30, with covering material 40 in the depicted embodiment being shown to completely fill remaining volume of capacitor openings 34. Covering material 40 may be entirely sacrificial, and regardless in one embodiment is selectively etchable relative to at least the material of conductive linings 35. One example is polysilicon where the material of conductive linings 35 is TiN.

After forming the covering material, both of the sacrificial material and at least a portion of the individual conductive linings that is elevationally between the upper and lower insulative materials in the individual capacitor openings are removed. Either may be removed before the other or both removed substantially simultaneously. Regardless and in one embodiment, the removing of both is conducted selectively (e.g., by selective etching) relative to the covering material and the upper and lower insulative materials. In one embodiment, the removing comprises removing at least a majority of the sacrificial material before removing the portion of the individual conductive linings that is elevationally between the upper and lower insulative materials in the individual capacitor openings. In one embodiment, the removing comprises removing the portion of the individual conductive linings that is elevationally between the upper and lower insulative materials in the individual capacitor openings before removing at least a majority of the sacrificial material.

Figure 9:
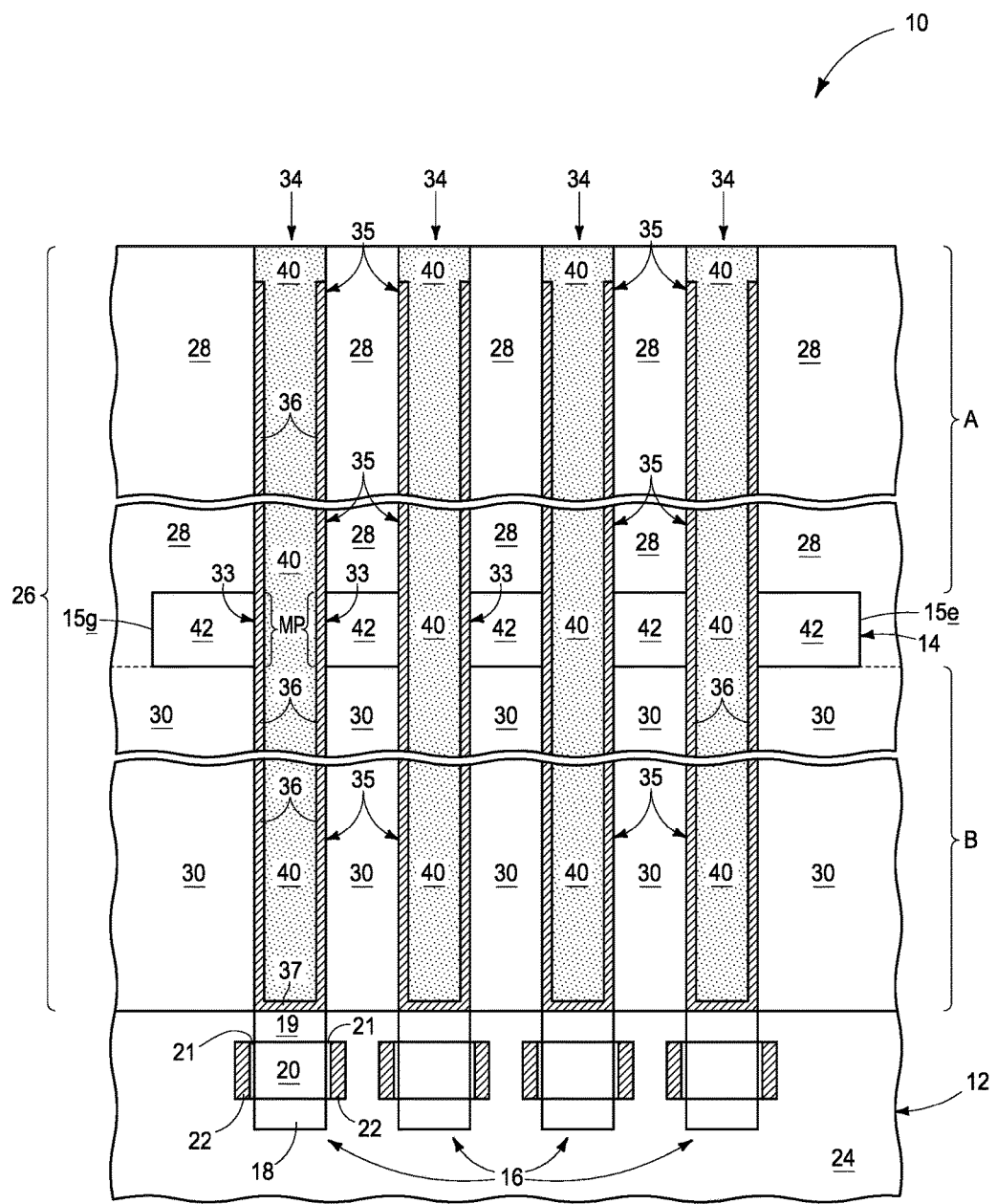
FIG. 9 is a view of the FIG. 8 construction at a processing step subsequent to that shown by FIG. 8.

FIG. 9 depicts an example embodiment wherein all sacrificial material 32 (not shown) has been removed first and selectively relative to covering material 40, the upper and lower insulative materials 28, 30, respectively, and the conductive material of linings 35. Access for etching chemicals to reach and contact sacrificial material 32 (not shown) may occur from array edges 15d and 15f (FIGS. 1 and 3). The sacrificial material may be removed using any suitable isotropic dry and/or wet etching chemistries. For example, where the sacrificial material comprises silicon nitride and where the covering material, upper insulative material 28, and lower insulative material 30 comprise silicon dioxide, an example isotropic wet etching chemistry is phosphoric acid. In one embodiment and as shown, removal of sacrificial material 32 forms a void space 42 elevationally between upper and lower insulative materials 28, 30, respectively, laterally between (e.g., laterally outward of) individual capacitor openings 34. In the depicted embodiment, void space 42 is a singular-interconnected void space within all of array area 14 and extends to each array edge 15d-g (FIGS. 1 and 3) and remains laterally open at opposing array edges 15d and 15f. Formation of void space 42 may be considered as forming an upper portion "A" of individual capacitor openings 34 that extends elevationally inward to void space 42 and forming a lower portion "B" of individual capacitor openings 34 that extends upward to void space 42.

Figure 10:
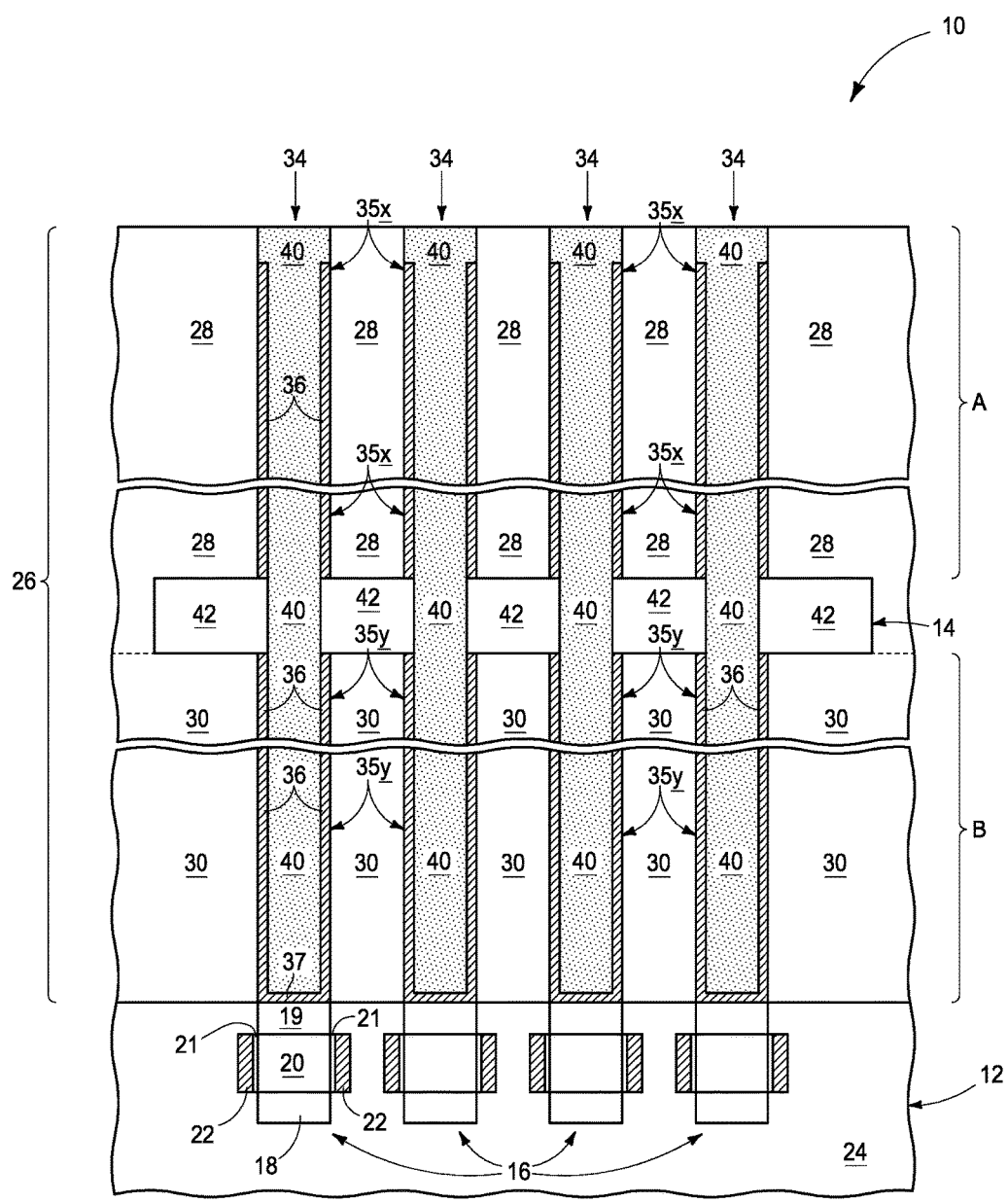
FIG. 10 is a view of the FIG. 9 construction at a processing step subsequent to that shown by FIG. 9.

Referring to FIG. 10, an elevational mid portion (not shown) of individual conductive linings 35 that was elevationally between upper and lower insulative materials 28, 30, respectively, within individual capacitor openings 34 has been removed. An example technique for such removing includes anisotropic etching of the material of conductive linings 35 from within void space 42, for example using an etching chemistry of $Cl_2$ and an inert gas, $Cl_2$ and HBr, or $CHF_3$ and an inert gas where the material of conductive linings 35 comprises TiN. Again, access for the etching chemistry to reach such material can be from array edges 15d and 15f (FIGS. 1 and 3). The removing of an elevational mid-portion of the individual conductive linings 35 forms an upper capacitor electrode lining 35x and a lower capacitor electrode lining 35y that are elevationally separate and spaced from one another in individual capacitor openings 34. In one embodiment and as shown, during the removing of the elevational mid-portions of conductive linings 35, covering material 40 is over at least a majority of the laterally-internal sidewalls of upwardly-open conductive linings 35 except for laterally internal-sidewalls of the mid-portions during such removing. FIG. 10 shows an example embodiment where etching of the mid-portions of conductive linings 35 has stopped elevationally coincident with the lower surface of void space 42 for lower capacitor electrode linings 35y and has stopped elevationally coincident with the upper surface of void space 42 for upper capacitor electrode linings 35x (e.g., the etching of the material of linings 35 has been perfectly anisotropic). Alternately by way of example only, the conductive material of conductive linings 35x and 35y might be recessed (not shown) upwardly and downwardly, respectively, with respect to the upper and lower surfaces of void space 42. In one embodiment, the forming of the conductive lining (FIGS. 6 and 7), the upper capacitor electrode lining (FIG. 10), and the lower capacitor electrode lining (FIG. 10) forms each to be totally encircling (i.e., circumferentially continuous) in the individual capacitor openings in horizontal cross-section, for example as shown. Alternately, the linings may not each be circumferentially continuous (not shown).

Figure 11:
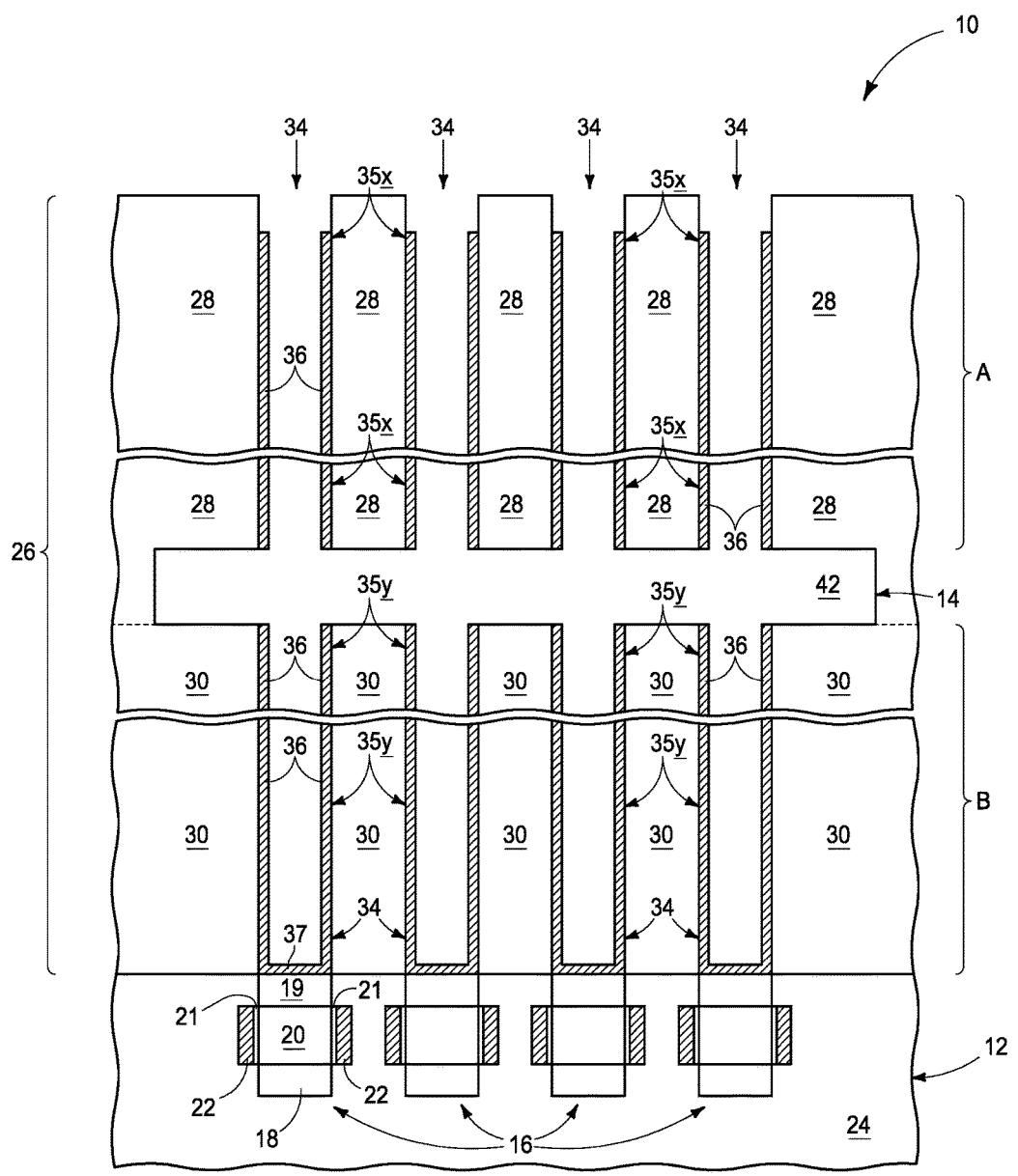
FIG. 11 is a view of the FIG. 10 construction at a processing step subsequent to that shown by FIG. 10.

Referring to FIG. 11, all covering material 40 (not shown) has been removed from the substrate, for example by any suitable isotropic or anisotropic etching. For example, tetramethyl-ammonium-hydroxide may be used where covering material 40 comprises polysilicon.

Figure 12:
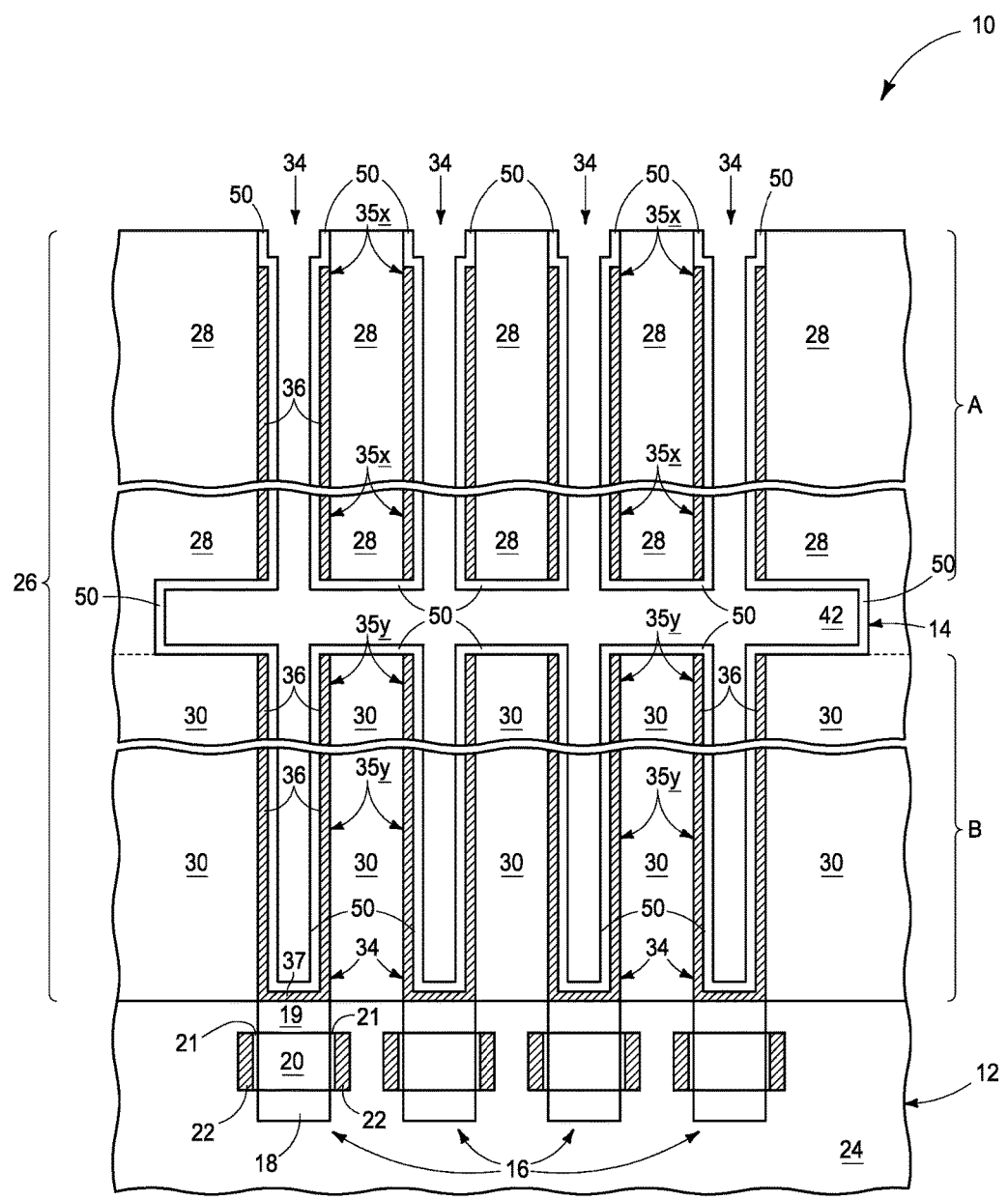
FIG. 12 is a view of the FIG. 11 construction at a processing step subsequent to that shown by FIG. 11.

Referring to FIG. 12, a capacitor insulator 50 has been formed laterally inward of upper capacitor electrode lining 35x and lower capacitor electrode lining 35y in individual capacitor openings 34 and against walls of void space 42 to less-than-fill such void space and less-than-fill remaining volume of the upper "A" and lower "B" portions of individual capacitor openings 34. In one example embodiment, capacitor insulator 50 comprises programmable material such that the capacitors that will be formed are non-volatile and programmable into at least two different magnitude capacitive states (e.g., whereby the programmable material is both sufficiently thick and remains insulative in the different states such that a current sufficient to erase a stored state does not flow there-through at operating voltages). Example such programmable materials include ferroelectric materials, conductive bridging RAM (CBRAM) materials, phase change materials, and resistive RAM (RRAM) materials, with ferroelectrics believed to be ideal. Example ferroelectric materials include ferroelectrics that have one or more of transition metal oxide, zirconium, zirconium oxide, niobium, niobium oxide, hafnium, hafnium oxide, lead zirconium titanate, and barium strontium titanate, and may have dopant therein which comprises one or more of silicon, aluminum, lanthanum, yttrium, erbium, calcium, magnesium, strontium, and a rare-earth element. In one embodiment, capacitor insulator 50 comprises dielectric material such that the capacitors are volatile. For example, such can comprise one or more of non-programmable dielectric materials such as silicon dioxide, silicon nitride, aluminum oxide, high-k dielectrics, etc. whereby no charge is retained in material 50 upon removal or sufficient reduction of voltage/potential from one or both of two capacitor electrodes of the capacitor. Non-volatile programmable capacitors may have a capacitor insulator that has a suitable combination of programmable material(s) and non-programmable material(s). Regardless, an example thickness for capacitor insulator 50 is 30 to 100 Angstroms.

Figure 13:
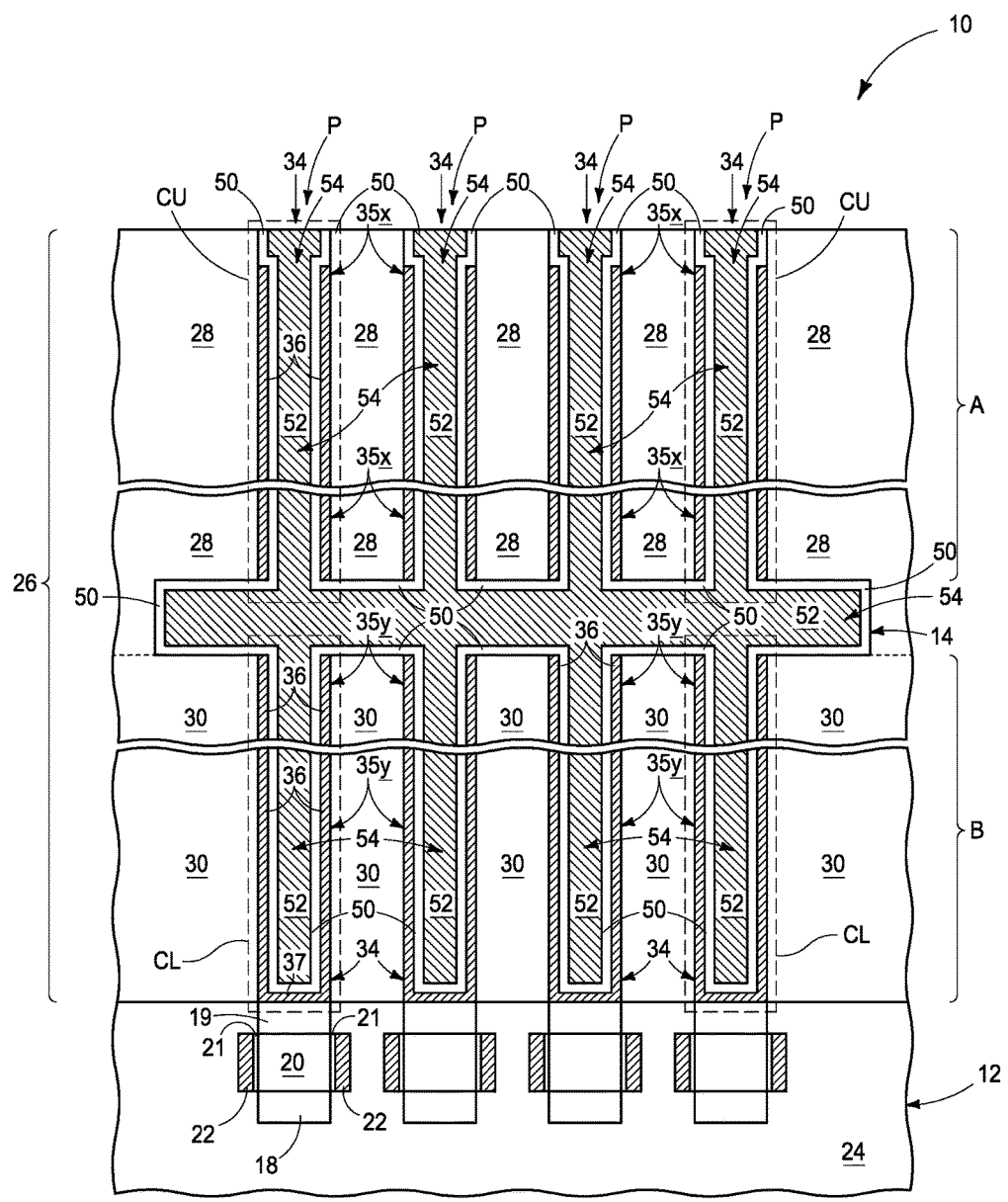
FIG. 13 is a view of the FIG. 12 construction at a processing step subsequent to that shown by FIG. 12.

Referring to FIG. 13, conductive material 52 has been formed laterally inward of capacitor insulator 50 in individual capacitor openings 34 and elevationally between upper and lower capacitor electrode linings 35x and 35y, respectively, in void space 42 (not designated in FIG. 13) and conductive material 52 has been formed to comprise a shared capacitor electrode 54 that is shared by vertically opposed capacitors in individual of the pairs of vertically opposed capacitors. For example and as shown in an ideal embodiment, upper capacitor electrode lining 35x, capacitor insulator 50, and shared capacitor electrode 54 comprise one capacitor (e.g., an upper capacitor CU), and lower capacitor electrode lining 35y, capacitor insulator 50, and shared capacitor electrode 54 comprise the other capacitor (e.g., a lower capacitor CL) of individual pairs "P" of two vertically opposed capacitors (e.g., CU and CL). In one embodiment and as shown, shared capacitor electrode 54 is also shared by multiple pairs P of vertically opposed capacitors CU and CL within array 14. In one embodiment and as shown, capacitor insulator 50 is directly against all top and bottom surfaces of shared capacitor electrode 54, and in one embodiment is directly against all sidewall edge surfaces of shared capacitor electrode 54. In one embodiment and as shown, conductive material 52 fills remaining void space laterally inward of capacitor insulator 50 in individual capacitor openings 34 and in one embodiment fills remaining volume of void space 42. Conductive material 52 of shared capacitor electrode 54 may be of the same or different composition as that of the conductive material of electrode linings 35x and 35y.

Where in some embodiments array edges 15d and 15f are laterally open, such may need to be effectively sealed or covered sometime after forming void space 42. Such may occur, by way of example, by deposition of a largely non-conformal dielectric layer prior to forming of capacitor insulator 50 (so it remains out of void space 42) to cover array edges 15d and 15f, followed by an anisotropic spacer-like etch thereof. Alternately and by way of another example only, conductive material 52 can be anisotropically etched (with or without additional masking) after its deposition where it is laterally outward of edges 15d and 15f, with a void space formed thereby subsequently being filled with dielectric material.

Figure 14:
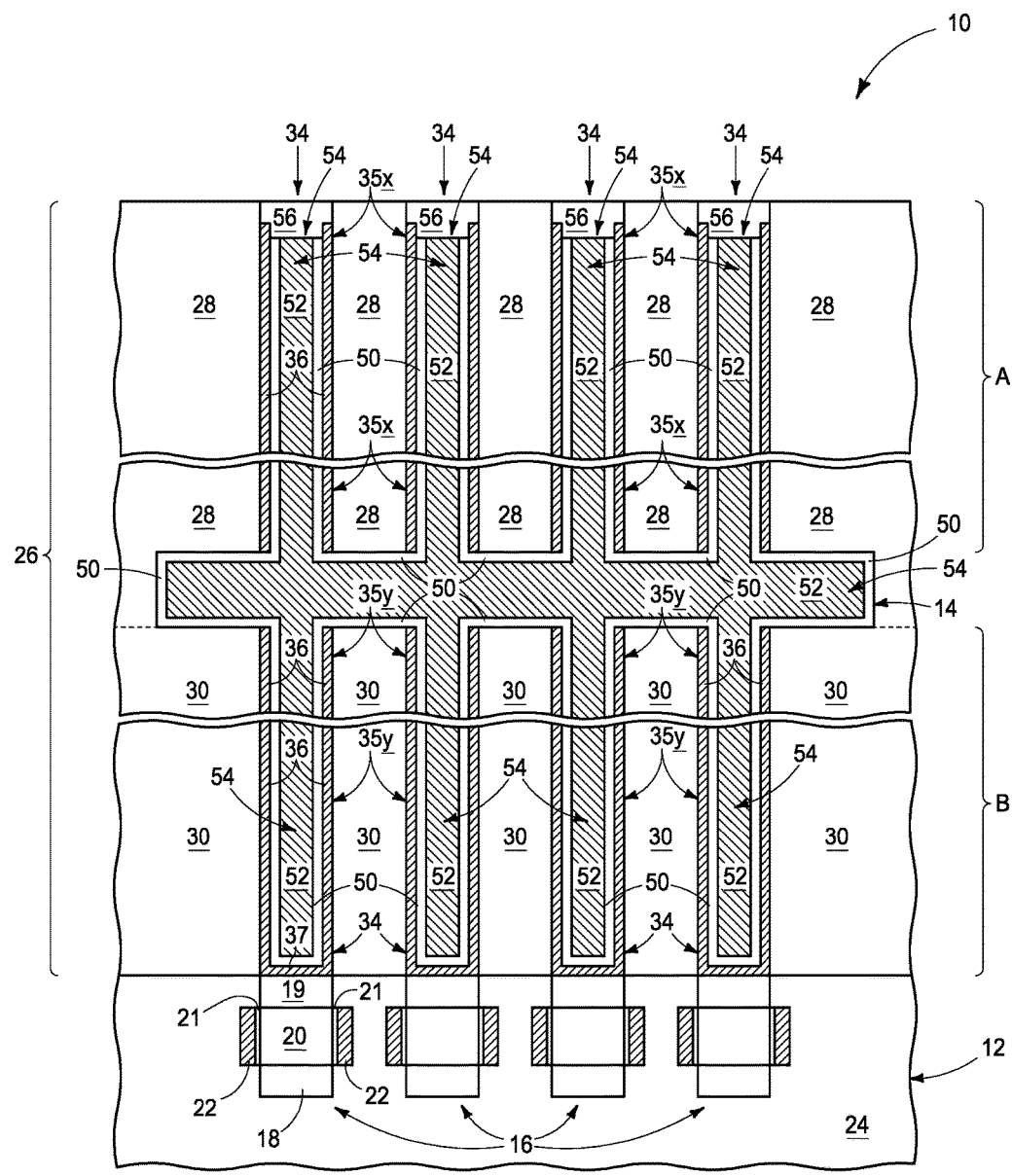
FIG. 14 is a view of the FIG. 13 construction at a processing step subsequent to that shown by FIG. 13.

Referring to FIG. 14 and in one embodiment, capacitor insulator 50 and conductive material 52 have been etched back selectively relative to material of upper capacitor electrode linings 35x ideally to recess upper surfaces of materials 50 and 52 elevationally inward of uppermost surfaces of upper capacitor electrode linings 35x. This has been followed by deposition and planarization back of an insulator material 56. Such may be of the same composition as one or both of upper insulative material 28 or capacitor insulator 50.

Figure 15:
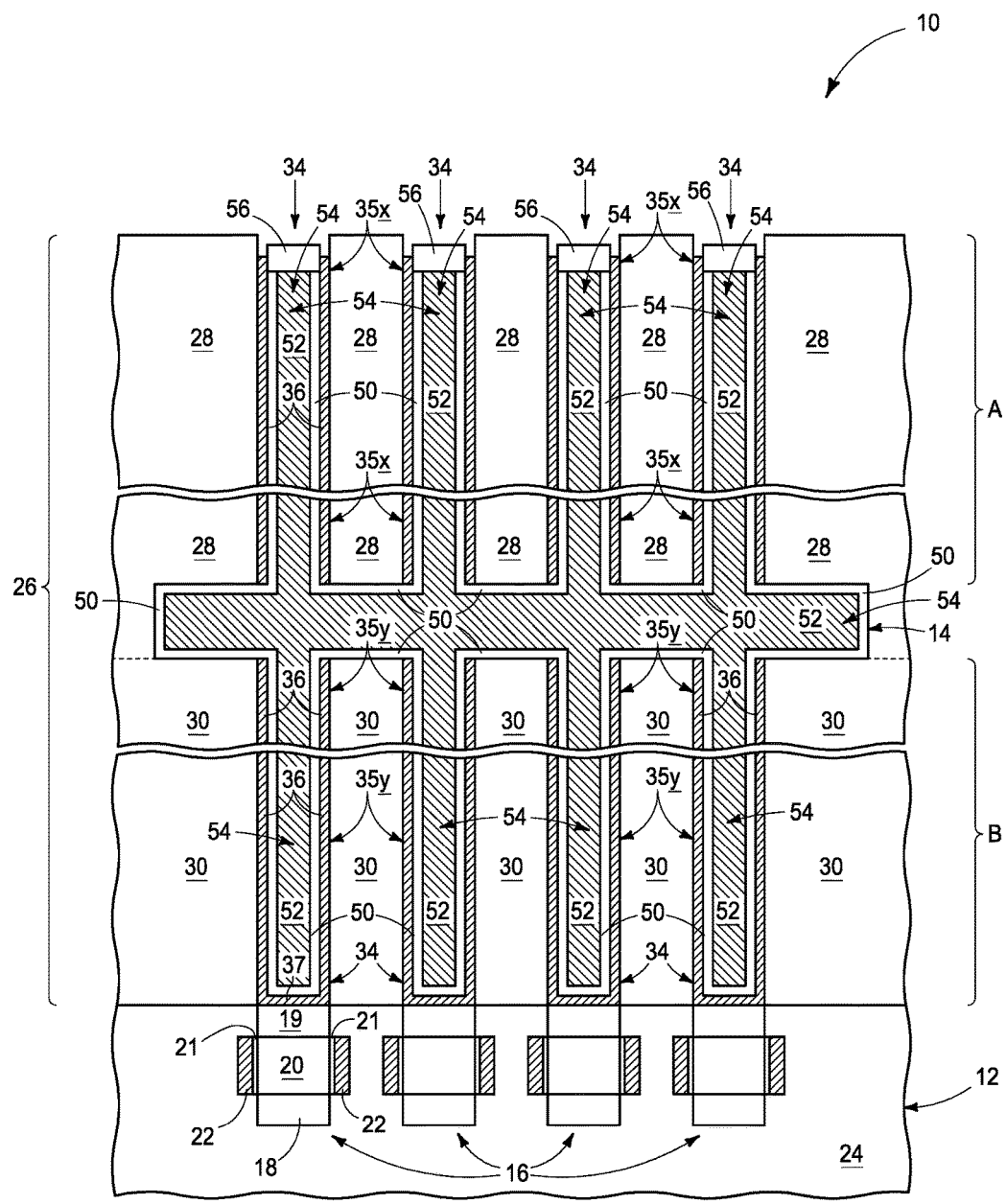
FIG. 15 is a view of the FIG. 14 construction at a processing step subsequent to that shown by FIG. 14.

Referring to FIG. 15, insulator material 56 has been subjected to a timed isotropic etch ideally producing the construction as shown. An example such etch where insulator material 56 comprises silicon dioxide is dilute HF.

Figure 16:
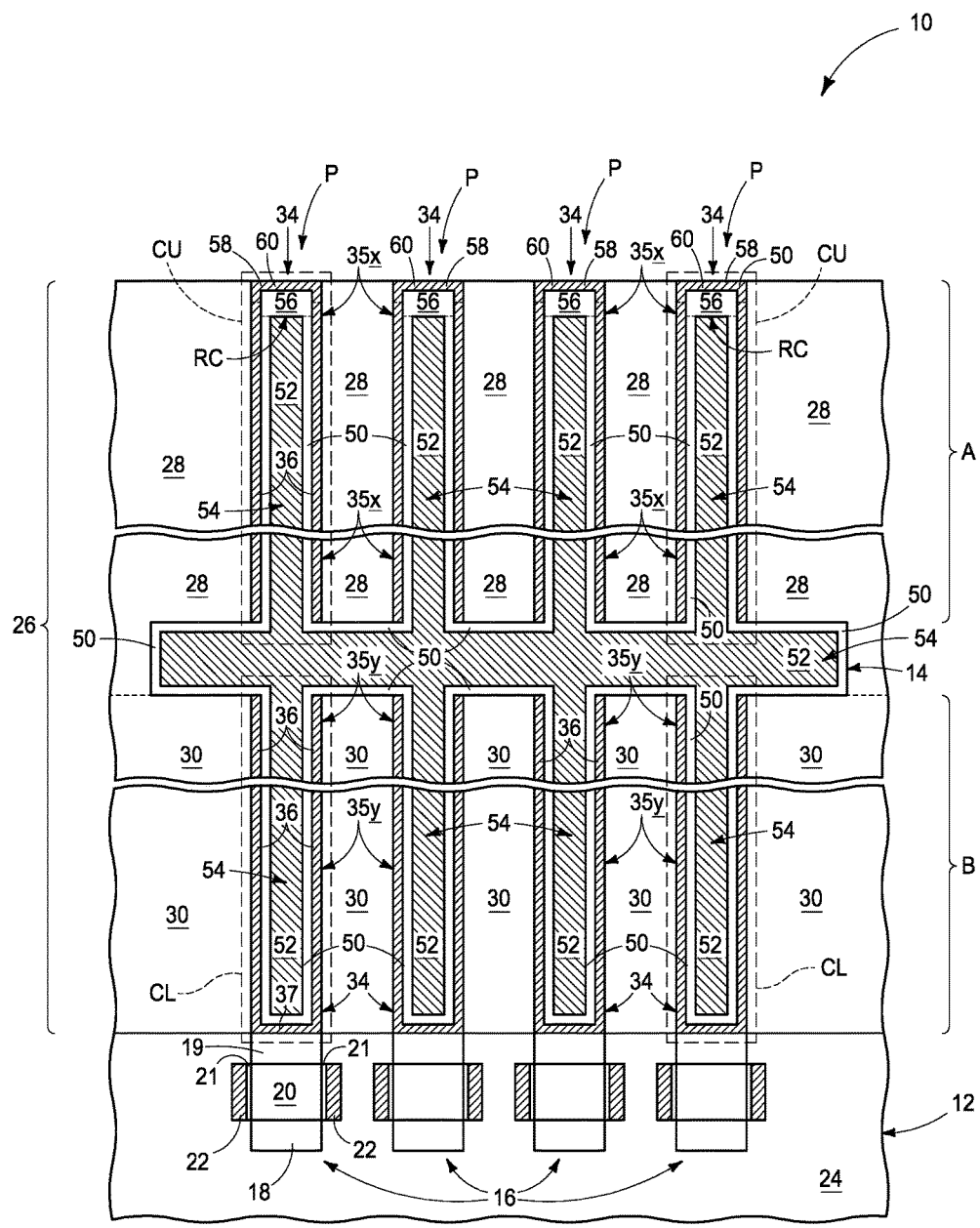
FIG. 16 is a view of the FIG. 15 construction at a processing step subsequent to that shown by FIG. 15.

Referring to FIG. 16, conductive material 58 has been deposited and planarized back to at least to the uppermost surface of upper insulative material 28. Conductive material 58 may be of the same composition (as shown) or different composition (not shown) as the material of upper capacitor electrode lining 35x. In one embodiment and as shown, such results in forming upper capacitor electrode lining 35x to comprise a downwardly-facing container shape comprising sidewalls 36 and a top 60 extending laterally to and between sidewalls 36. In such embodiment, insulator material 56 essentially comprises or forms (along with material 50) a part of the capacitor insulator for upper capacitor CU. Thereby, capacitor insulator 50/56 is elevationally thicker between top 60 of upper capacitor electrode lining 35x and shared capacitor electrode 54 at its lateral center RC than it is laterally thick between sidewalls 36 of upper capacitor electrode lining 35x and shared capacitor electrode 54.

As an alternate but less ideal example, the substrate of FIG. 12 might be planarized back (not shown) at least to a point of upwardly exposing material of upper capacitor electrode linings 35x. However, such may then require covering of conductive material 52 of shared electrode 54 to prevent conductive material 58 from shorting the electrodes of upper capacitor CU together.

Figure 17:
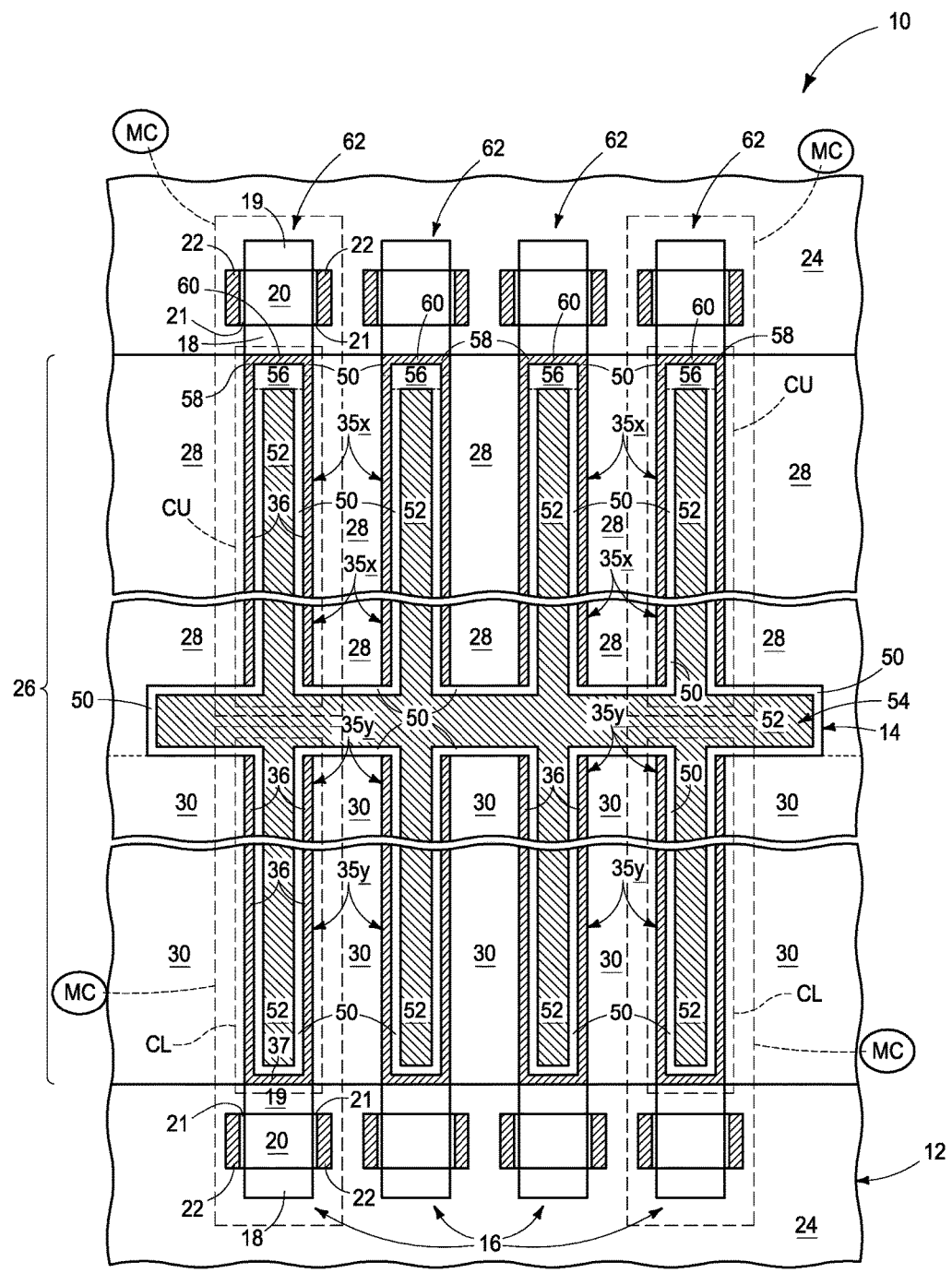
FIG. 17 is a view of the FIG. 16 construction at a processing step subsequent to that shown by FIG. 16.

In one embodiment, vertically opposed capacitors CU and CL are formed to individually comprise an individual memory cell of memory circuitry. For example and by way of example only, FIG. 17 shows subsequent processing wherein transistors 62 have been formed of like construction to that of transistors 16. In some embodiments, transistors 62 are referred to as upper transistors. Inner source/drain regions 18 thereof electrically couple (e.g., directly) to individual capacitors CU through tops 60. Individual memory cells MC may be formed, for example which may comprise a one-transistor and one-capacitor (e.g., a 1T-1C) memory cell and which may be volatile or non-volatile depending on composition of the capacitor insulator. Alternately by way of example, individual memory cells may be formed to comprise a two-transistor and two-capacitor (e.g., a 2T-2C) memory cell and which may be volatile or non-volatile depending on composition of the capacitor insulator, for example as further described below. Other memory cells may be fabricated, and/or including integrated circuitry comprising an array of vertically opposed pairs of capacitors that are not of memory circuitry.

The above described embodiment both removed the sacrificial material to form the void space before removing the elevational mid-portions of the individual conductive linings and by a technique whereby the removing of those elevational mid-portions started from a laterally-outer side of such elevational mid-portions. For example, FIG. 9 designates a mid-portion MP of the far-left lining 35 and laterally-outer sides 33 thereof. The removing in FIG. 10 of mid-portions MP begins from laterally-outer sides 33. An alternate example embodiment is next described with reference to FIGS. 18-24 with respect to an alternate construction 10a. Like numerals from the above-described embodiments have been used where appropriate, with some construction differences being indicated with the suffix "a".

Figure 18:
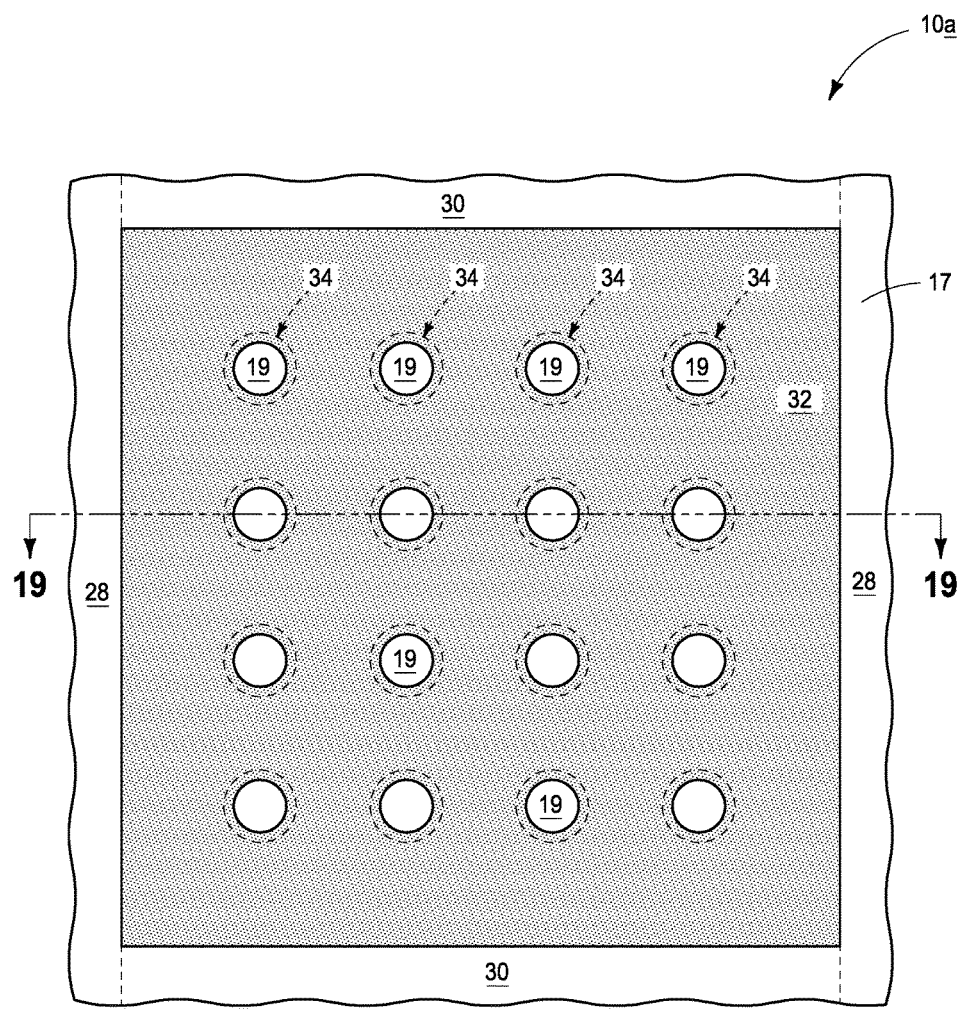
FIG. 18 is a diagrammatic cross-sectional view of a substrate construction in process in accordance with an embodiment of the invention, and is taken through line 18-18 in FIG. 19.
Figure 19:
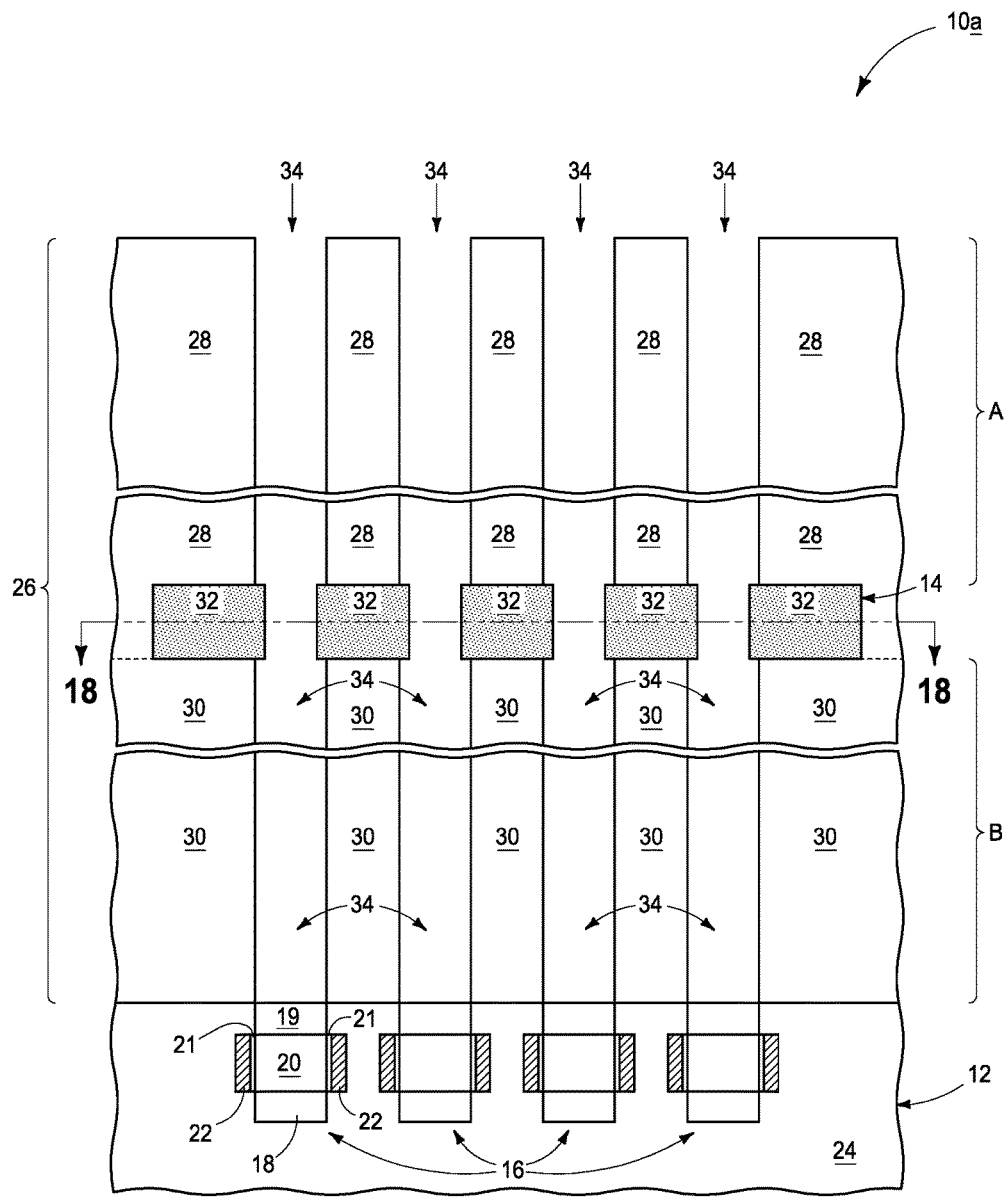
FIG. 19 is a cross-sectional view taken through line 19-19 in FIG. 18.

Referring to FIGS. 18 and 19, construction 10a comprises a sacrificial material 32. A ledge or lateral projection of material 32 is created which extends laterally/radially into individual capacitor openings 34 as shown. By way of example only, the construction of FIGS. 18 and 19 may result from wet anisotropically etching insulative materials 28 and 30 selectively relative to sacrificial material 32 after initial formation of capacitor openings 34. An example chemistry is dilute HF where insulative materials 28 and 30 are silicon dioxide and sacrificial material 32 is silicon nitride.

Figure 20:
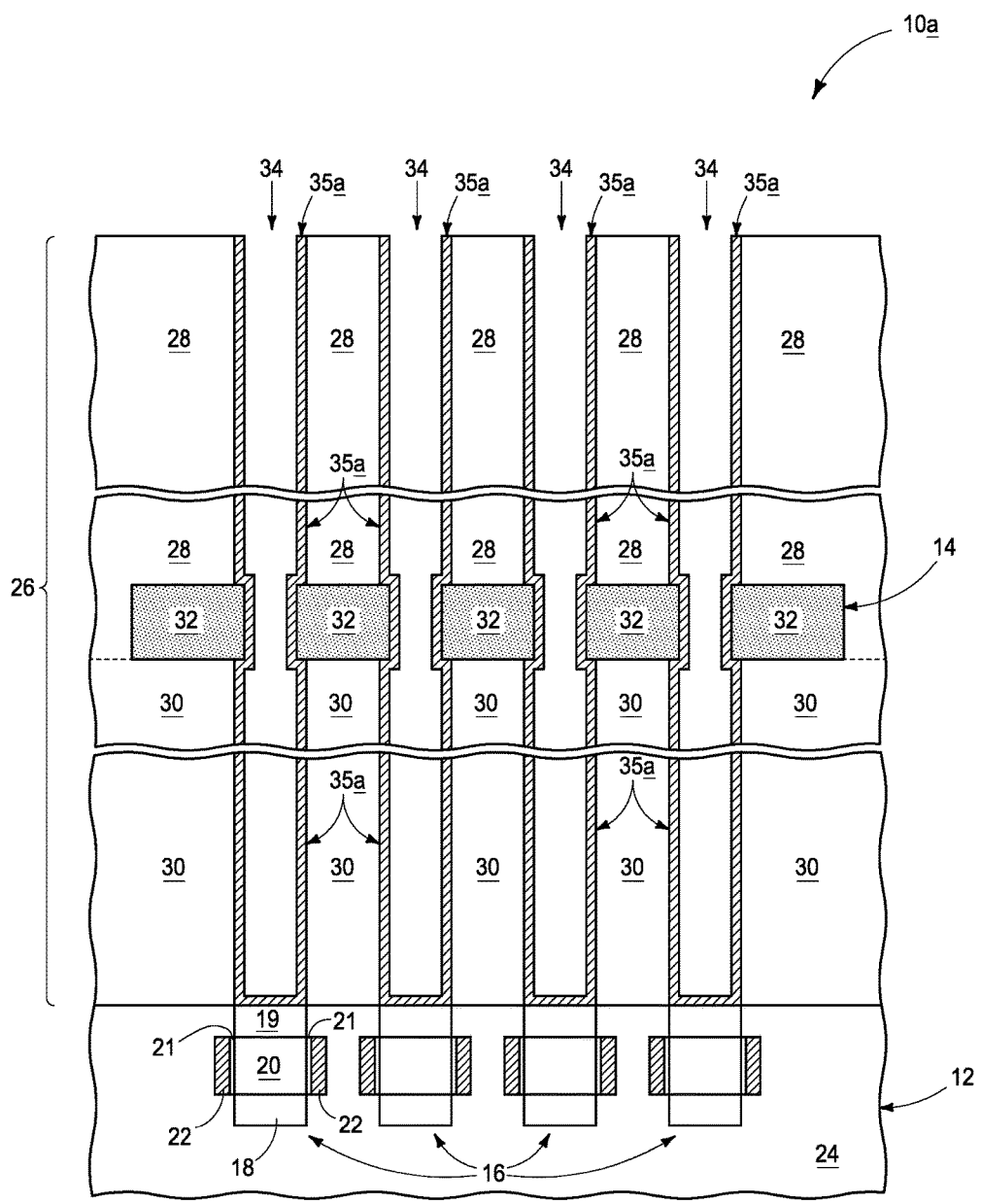
FIG. 20 is a view of the FIG. 19 construction at a processing step subsequent to that shown by FIG. 19.

Referring to FIG. 20, a conductive lining 35a has been formed in individual capacitor openings 34.

Figure 21:
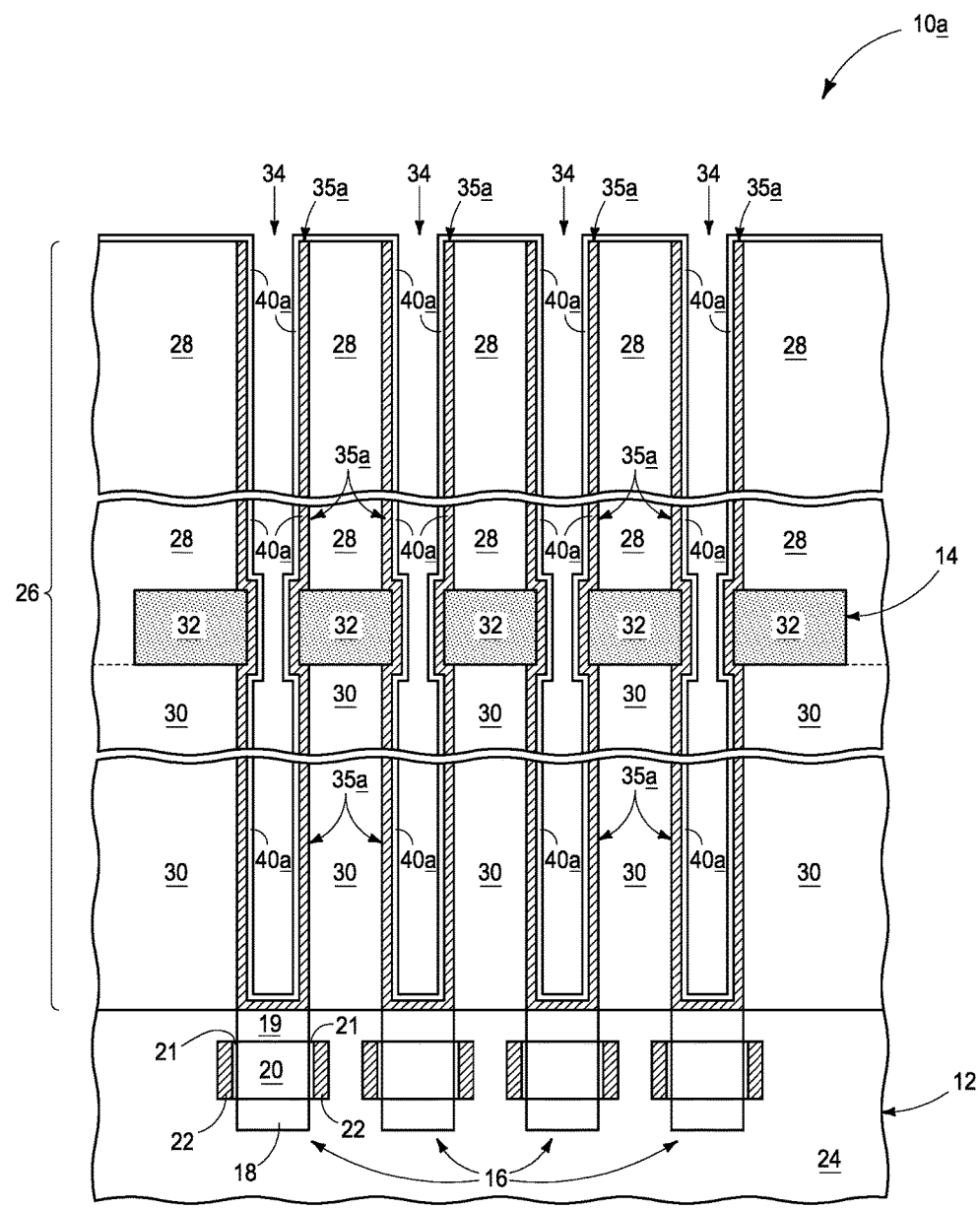
FIG. 21 is a view of the FIG. 20 construction at a processing step subsequent to that shown by FIG. 20.

Referring to FIG. 21, covering material 40a as a lining has been formed to line and less-than-fill remaining volume of capacitor openings 34.

Figure 22:
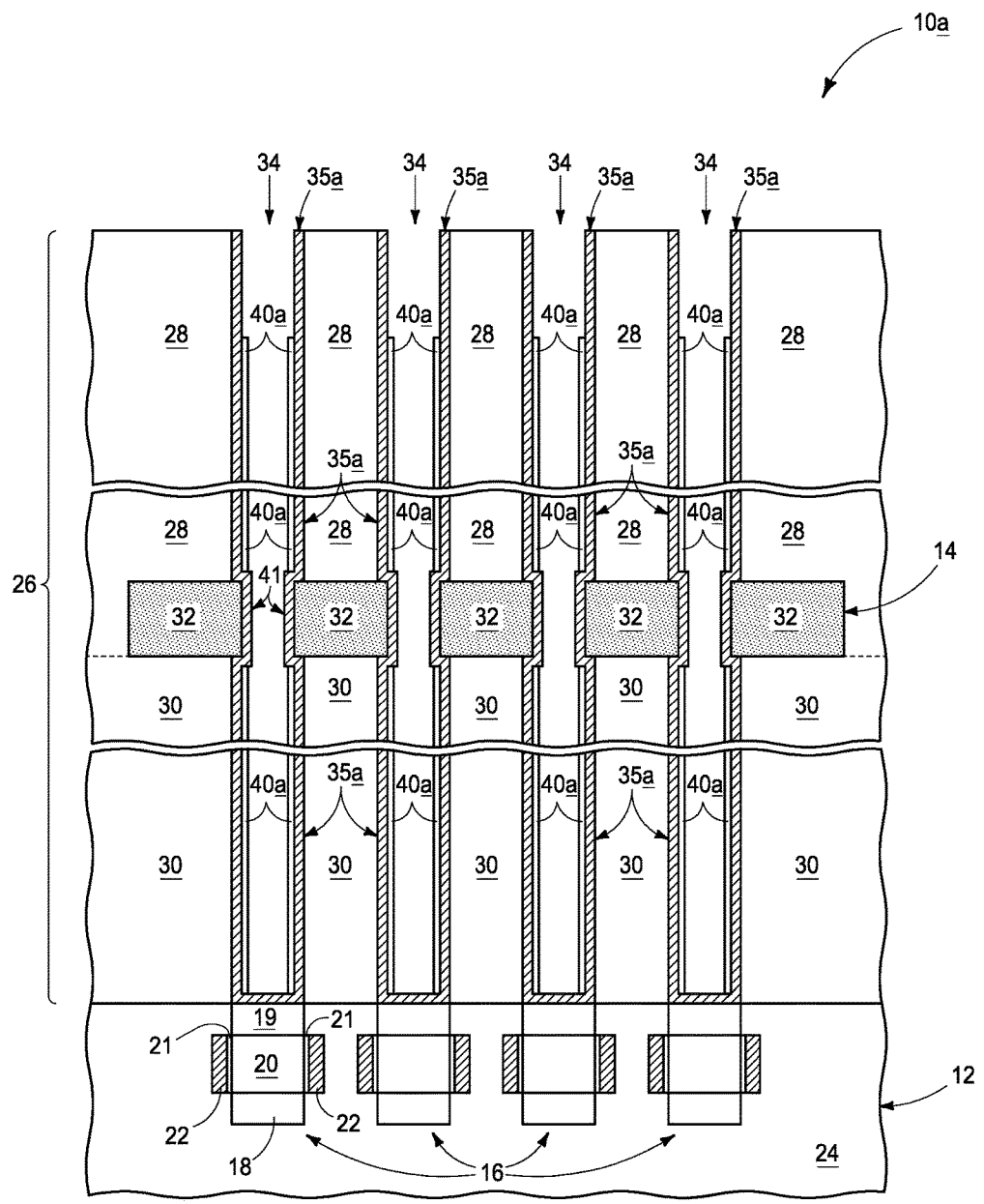
FIG. 22 is a view of the FIG. 21 construction at a processing step subsequent to that shown by FIG. 21.

Referring to FIG. 22, covering material 40a has been anisotropically etched to remove it from being over horizontal surfaces and from being elevationally along those portions of conductive lining 35a that are laterally/radially inward of sacrificial material 32.

Figure 23:
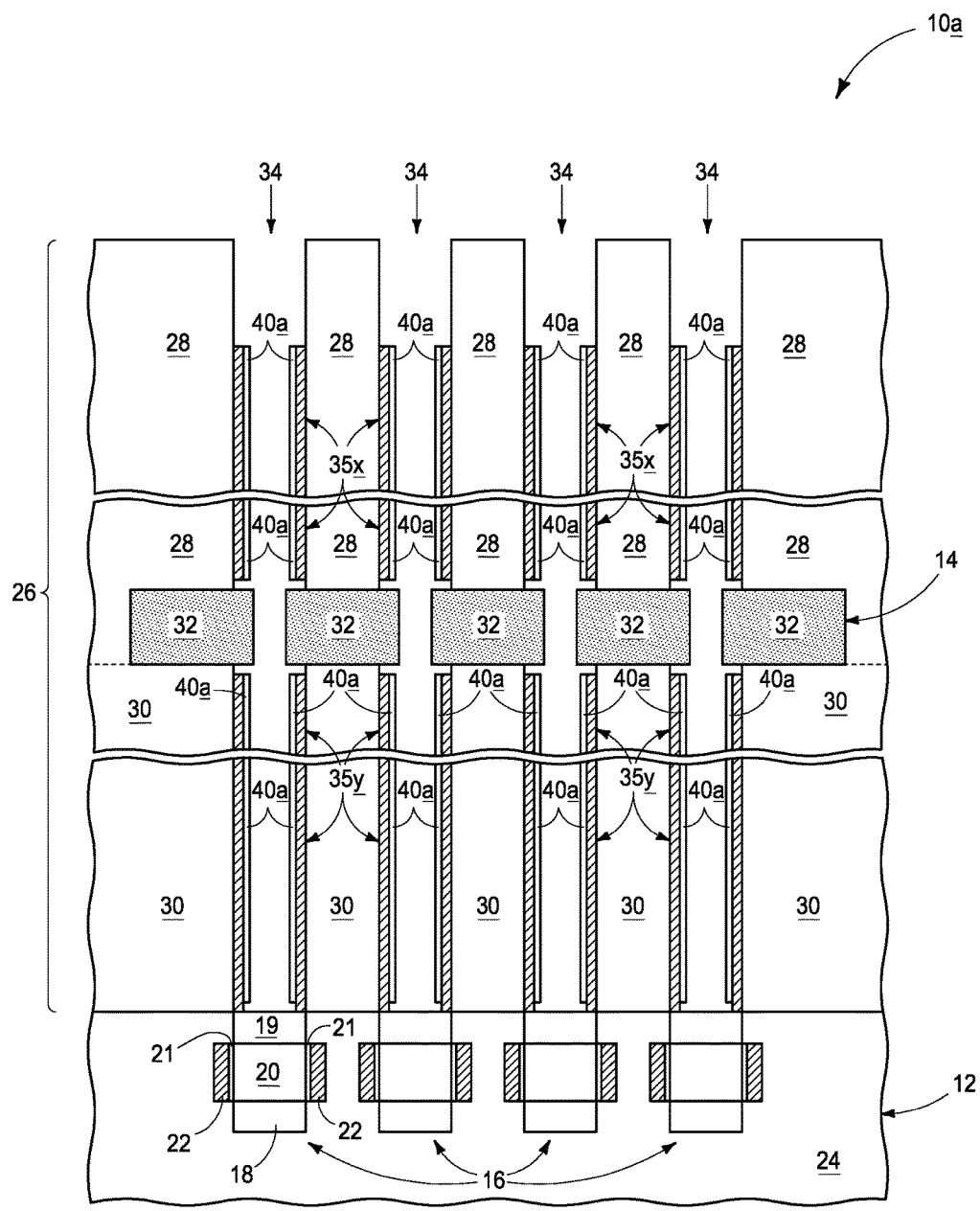
FIG. 23 is a view of the FIG. 22 construction at a processing step subsequent to that shown by FIG. 22.

Referring to FIG. 23, an elevational mid-portion (not shown) of individual conductive linings 35a has been removed to form upper capacitor electrode linings 35x and lower capacitor electrode linings 35y. Such may be conducted by any suitable anisotropic etch of the material conductive lining 35a of FIG. 22. Accordingly, such discloses but one embodiment wherein an act of removing of the mid-portions (not shown in FIG. 23) of individual conductive linings 35a comprises etching thereof starting from a laterally-inner side 41 (FIG. 22) of such elevational mid-portions as opposed to a laterally outer side of such portions as in the first-described embodiments.

Figure 24:
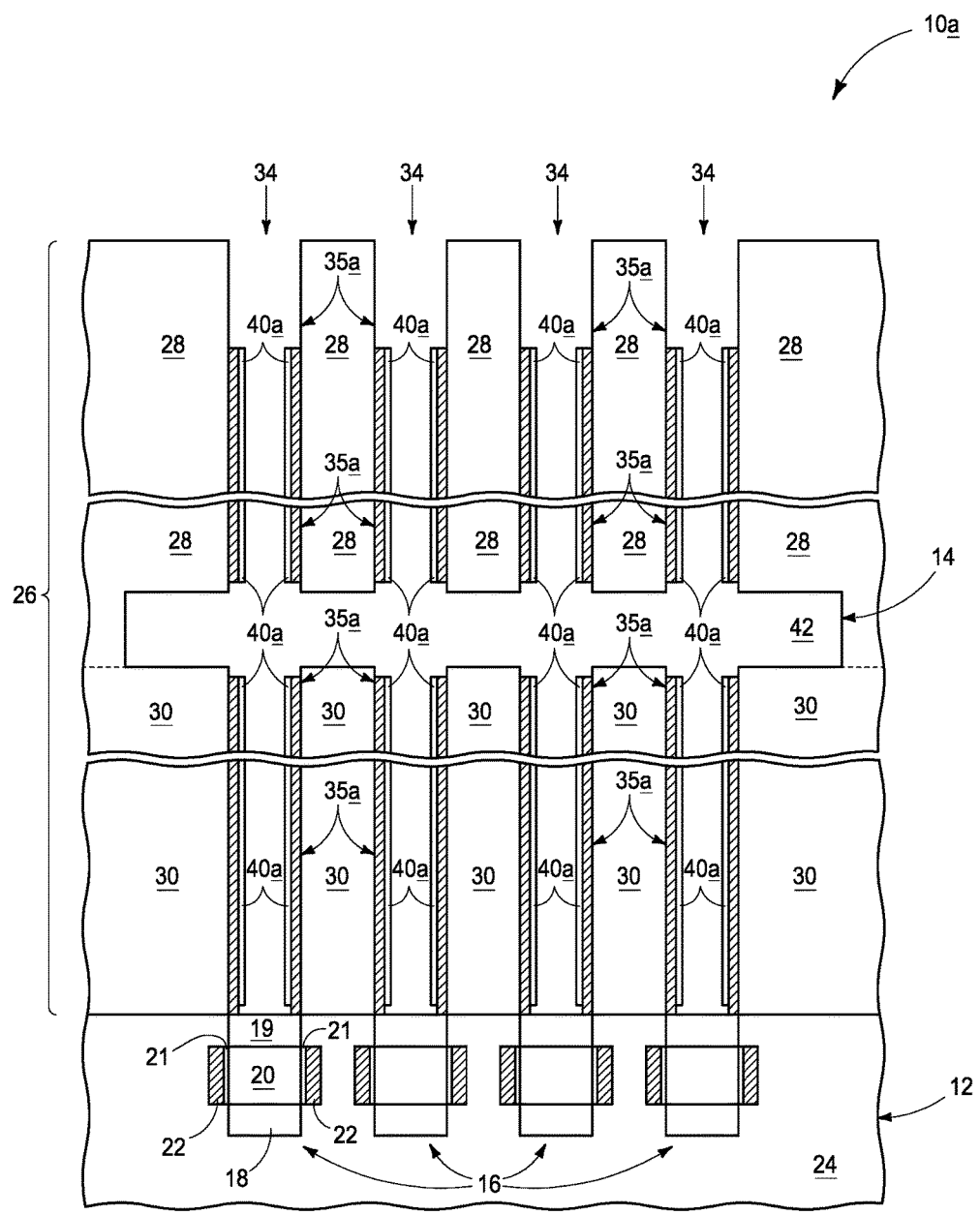
FIG. 24 is a view of the FIG. 23 construction at a processing step subsequent to that shown by FIG. 23.

Referring to FIG. 24, sacrificial material 32 (not shown) and covering material 40a (not shown) have been removed from the substrate, for example by etching, forming void space 42. Materials 32 and 40a may be removed in any order or substantially simultaneously. Material 40a may remain if it is of a desired insulative composition to function as a capacitor insulator as described above. Regardless and accordingly, such is but one example embodiment wherein removing of the sacrificial material to form void space 42 occurs after removing the elevational mid-portions of the conductive linings. Processing can occur subsequently to FIG. 24 along the lines of that describe above with respect to FIGS. 11-17, or otherwise.

An embodiment of the invention encompasses a method of forming an array comprising pairs of vertical opposed capacitors. Such a method includes forming a conductive lining (e.g., 35, 35a) in individual capacitor openings (e.g., 34) in insulative-comprising material (e.g., 26, and regardless of presence of a sacrificial material 32). Elevational mid-portions of the individual conductive linings are removed to form an upper capacitor electrode lining (e.g., 35x) and a lower capacitor electrode lining (e.g., 35y) that are elevationally separate and spaced from one another in the individual capacitor openings (i.e., independent of whether a void space is formed). A capacitor insulator (e.g., 50) is ultimately provided laterally inward of the upper and lower conductive linings in the individual capacitor openings. Conductive material (e.g., 52) is deposited laterally inward of the capacitor insulator in the individual capacitor openings and elevationally between conductive linings, with such conductive material ultimately being formed to comprise a shared capacitor electrode (e.g., 54) that is shared by vertically opposed capacitors (e.g., CU and CL) in individual of the pairs (e.g., P) of vertically opposed capacitors. Any other attribute(s) or aspect(s) as described herein and/or shown may be used.

Embodiments of the invention also encompass an array comprising pairs of vertically opposed capacitors independent of method of manufacture. However, an array comprising pairs of vertically opposed capacitors may have any of the attribute(s) or aspect(s) as described herein and/or shown. In one embodiment, the pairs (e.g., P) individually comprise an upper capacitor electrode lining (e.g., 35x) and a lower capacitor electrode lining (e.g., 35y) that are elevationally separate and spaced from one another. A shared capacitor electrode (e.g., 54) is provided that is shared by the vertically opposed capacitors (e.g., CU and CL) in individual of the pairs. The shared capacitor electrode is laterally inward of and elevationally between the upper and lower capacitor electrode linings. In one embodiment, the shared capacitor electrode is also shared by multiple of the pairs of vertically opposed capacitors. A capacitor insulator (e.g., 50) is between the shared capacitor electrode and the upper and lower capacitor electrode linings, and in one embodiment such capacitor insulator is directly against all top and bottom surfaces of the shared capacitor electrode. In one embodiment, the capacitor insulator is directly against all sidewall edge surfaces of the shared capacitor electrode. In one embodiment, the upper capacitor electrode lining comprises conductive material (e.g., 58 and the material of lining 35x) of a downwardly-facing container shape comprising sidewalls (e.g., 36) and a top (e.g., 60) extending laterally to and between the sidewalls. In one such embodiment, the capacitor insulator (e.g., 56/50) is elevationally thicker between the top of the upper capacitor electrode lining and the shared capacitor electrode at its lateral center than it is laterally thick between the sidewalls and the upper capacitor electrode lining in the shared capacitor electrode. Any other attribute(s) or aspect(s) as described herein and/or shown may be used.

In one embodiment, pairs (e.g., P) of vertically opposed upper and lower capacitors (e.g., CU and CL) individually comprise an upper capacitor electrode (e.g., 35x) of the upper capacitor and a lower capacitor electrode (e.g., 35y) of the lower capacitor, with such being elevationally separate and spaced from one another. A shared capacitor electrode (e.g., 54) is shared by the vertically opposed upper and lower capacitors in individual of the pairs. The shared capacitor electrode is laterally inward of and elevationally between the upper and lower capacitor electrodes. A capacitor insulator (e.g., 50) is between the shared capacitor electrode and the upper and lower capacitor electrodes. The upper capacitor electrode comprises conductive material (e.g., 58 and the material of lining 35x) of a downwardly-facing container shape comprising sidewalls (e.g., 36) and a top (e.g., 60) extending laterally to and between the sidewalls. The capacitor insulator (e.g., 54/50) is elevationally thicker between the top of the upper capacitor electrode and the shared capacitor electrode at its lateral center than it is laterally thick between the sidewalls of the upper capacitor electrode and the shared capacitor electrode. In one embodiment, the shared capacitor electrode is also shared by multiple of the pairs of vertically opposed capacitors, and in one embodiment the capacitor insulator extends laterally continuously between immediately adjacent of the pairs of vertically opposed capacitors. Any other attribute(s) or aspect(s) as described herein and/or shown may be used.

In one embodiment, a memory array comprises pairs of vertically opposed capacitors, with the pairs individually comprising an upper capacitor electrode lining and a lower capacitor electrode lining that are elevationally separate and spaced from one another. The upper and lower capacitors are in two different memory cells of the memory array (e.g., as shown in FIG. 17). A shared capacitor electrode is shared by the vertically opposed capacitors in individual of the pairs. The shared capacitor electrode is laterally inward of and elevationally between the upper and lower capacitor electrode linings. A capacitor insulator is between the shared capacitor electrode and the upper and lower capacitor electrode linings. The capacitor insulator is directly against all top and bottom surfaces of the shared capacitor electrode. Upper transistors are individually elevationally outward of and electrically coupled to one of the upper capacitor electrode linings to comprise one 1T-1C memory cell of the array (e.g., as shown in FIG. 17). Lower transistors are individually elevationally inward of and electrically coupled to one of the lower capacitor electrode linings to comprise another 1T-1C memory cell of the array.

Figure 25:
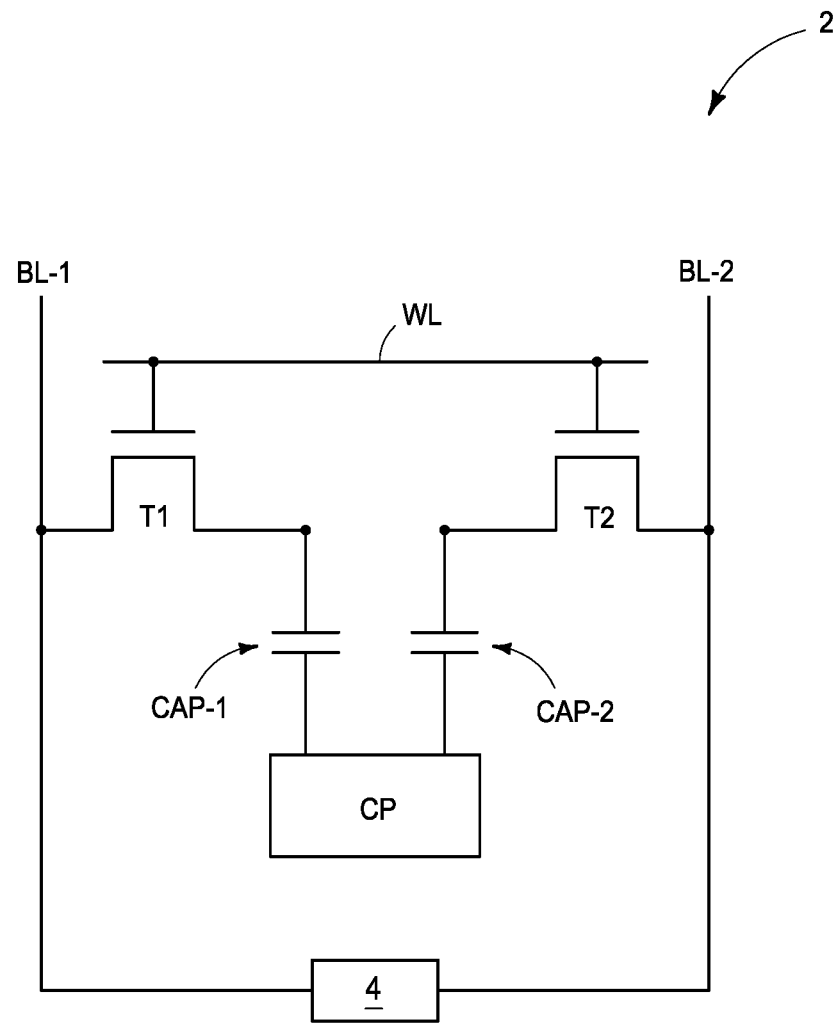
FIG. 25 is a schematic of a two transistor and two capacitor memory cell in accordance with an embodiment of the invention.

In memory arrays, individual memory cells having vertically opposed capacitors may be fabricated in other memory architectures than that shown in FIG. 17, for example in a 2T-2C architecture as is schematically shown in FIG. 25. A 2T-2C memory cell is schematically illustrated in FIG. 25 as a memory cell 2. The two transistors of the memory cell are labeled as T1 and T2, and the two capacitors are labeled as CAP-1 and CAP-2. A source/drain region of first transistor T1 connects with a node of first capacitor (CAP-1), and the other source/drain region of T1 connects with a first comparative bitline (BL-1). A gate of T1 connects with a wordline (WL). A source/drain region of second transistor T2 connects with a node of second capacitor (CAP-2), and the other source/drain region of T2 connects with a second comparative bitline BL-2. A gate of T2 connects with wordline WL. Each of the first and second capacitors (CAP-1 and CAP-2) has a node electrically coupled with a common plate (CP). The common plate may be coupled with any suitable voltage. Comparative bitlines BL-1 and BL-2 extend to circuitry 4 which compares electrical properties (e.g., voltage) of the two to ascertain a memory state of memory cell 2. An advantage of a 2T-2C memory cell is that a memory state may be ascertained by comparing the electrical properties of the two comparative bitlines BL-1 and BL-2 to one another. Accordingly, a reference bitline associated with other memory (for instance, 1T-1C memory) may be omitted. In such an embodiment, BL-1 and BL-2 may be electrically coupled to the same sense amplifier as part of circuitry 4.

Figure 26:
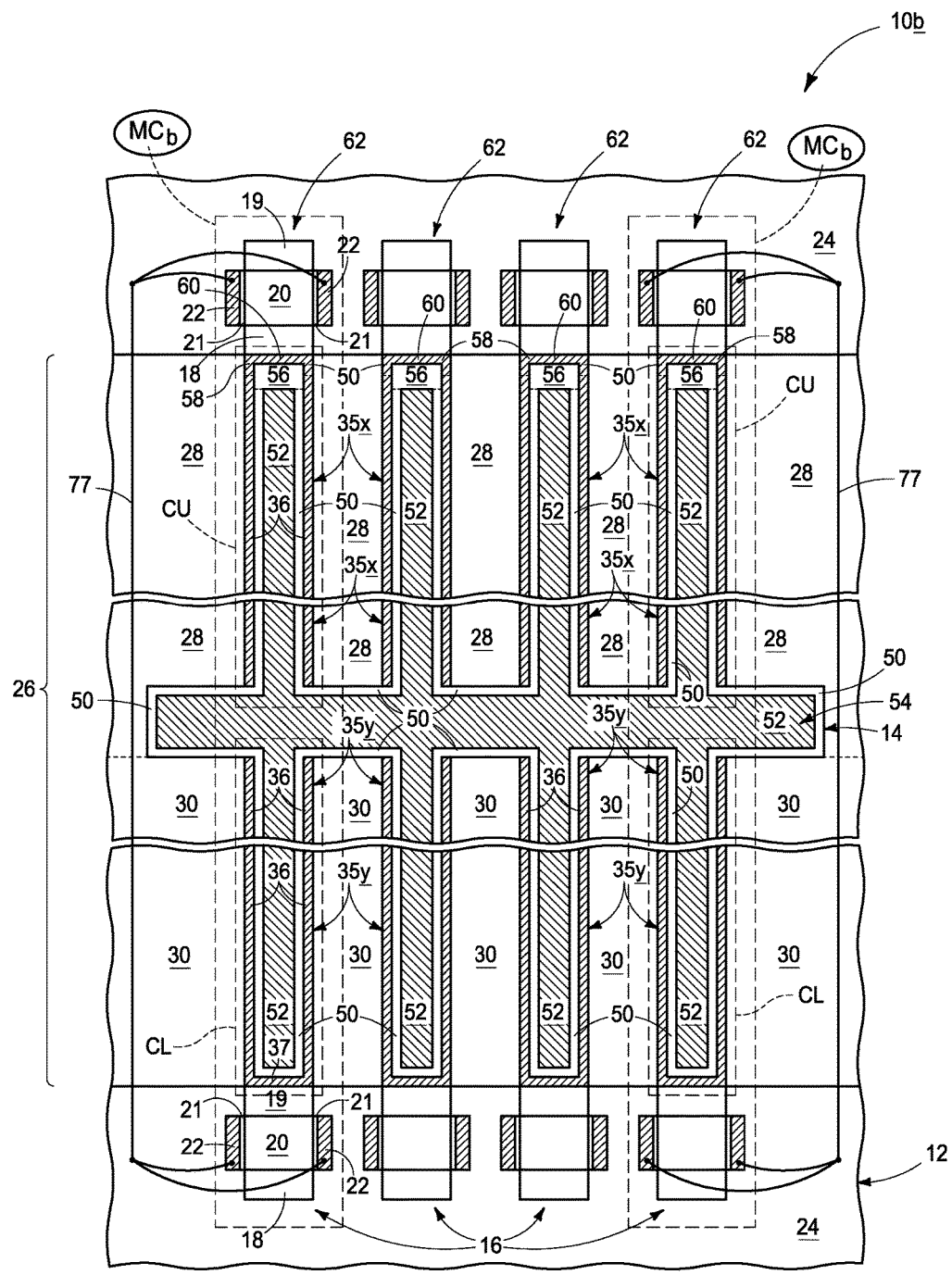
FIG. 26 is a hybrid schematic and diagrammatic cross-sectional view of a 2T/2C construction in accordance with an embodiment of the invention.

An alternate embodiment construction to that of FIG. 17 that may comprise 2T-2C architecture like that shown in FIG. 25 is shown in FIG. 26. Like numerals from the above-described embodiments have been used where appropriate, with some construction differences being indicated with the suffix "b" or different numerals. Construction 10b comprises individual memory cells $MC_b$ of 2T-2C architecture and which may be volatile or non-volatile depending on composition of the capacitor insulator. Construction 10b comprises a memory array having pairs of vertically opposed capacitors CU and CL, with the pairs individually comprising upper capacitor electrode lining 35x and lower capacitor electrode lining 35y that are elevationally separate and spaced from one another. The pairs of upper and lower capacitors (CU and CL) are in a same individual 2T-2C memory cell $MC_b$ of the memory array. Shared capacitor electrode 54 is shared by the vertically opposed capacitors in individual of the pairs, with shared capacitor electrode 54 being laterally inward of and elevationally between the upper and lower capacitor electrode linings. Capacitor insulator 50 is between the shared capacitor electrode and the upper and lower capacitor electrode linings, with the capacitor insulator being directly against all top and bottom surfaces of shared capacitor electrode 54. Upper transistors 62 are individually elevationally outward of and electrically coupled (in one embodiment directly electrically coupled) to one of the upper capacitor electrode linings. Lower transistors 16 are individually elevationally inward of and electrically coupled to one of the lower capacitor electrode linings. Pairs of one of the upper transistors and one of the lower transistors have their respective gates directly electrically coupled together to comprise individual 2T-2C memory cells $MC_b$ of the memory array. Such is shown schematically in FIG. 26 by conductive interconnects 77 for only the two laterally outermost memory cells designated in the figure for clarity. Construction (not shown) for interconnects 77 may be within and/or out of the plane of the page upon which FIG. 26 lies. One bitline (not shown) may electrically couple to a source/drain region 19 of an upper transistor 62 and another bitline (not shown) may electrically couple to a source/drain region 18 of a lower transistor 16 of an individual memory cell $MC_b$. In one embodiment, respective one source/drain regions of the one upper transistor and the one lower transistor (e.g., 19 of upper transistor 62 and 18 of lower transistor 16) in individual of the pairs are electrically coupled to a respective one of two comparative bitlines that are electrically coupled to the same sense amplifier as described above with respect to FIG. 25. Any other attribute(s) or aspect(s) as described herein and/or shown may be used.

Figure 27:
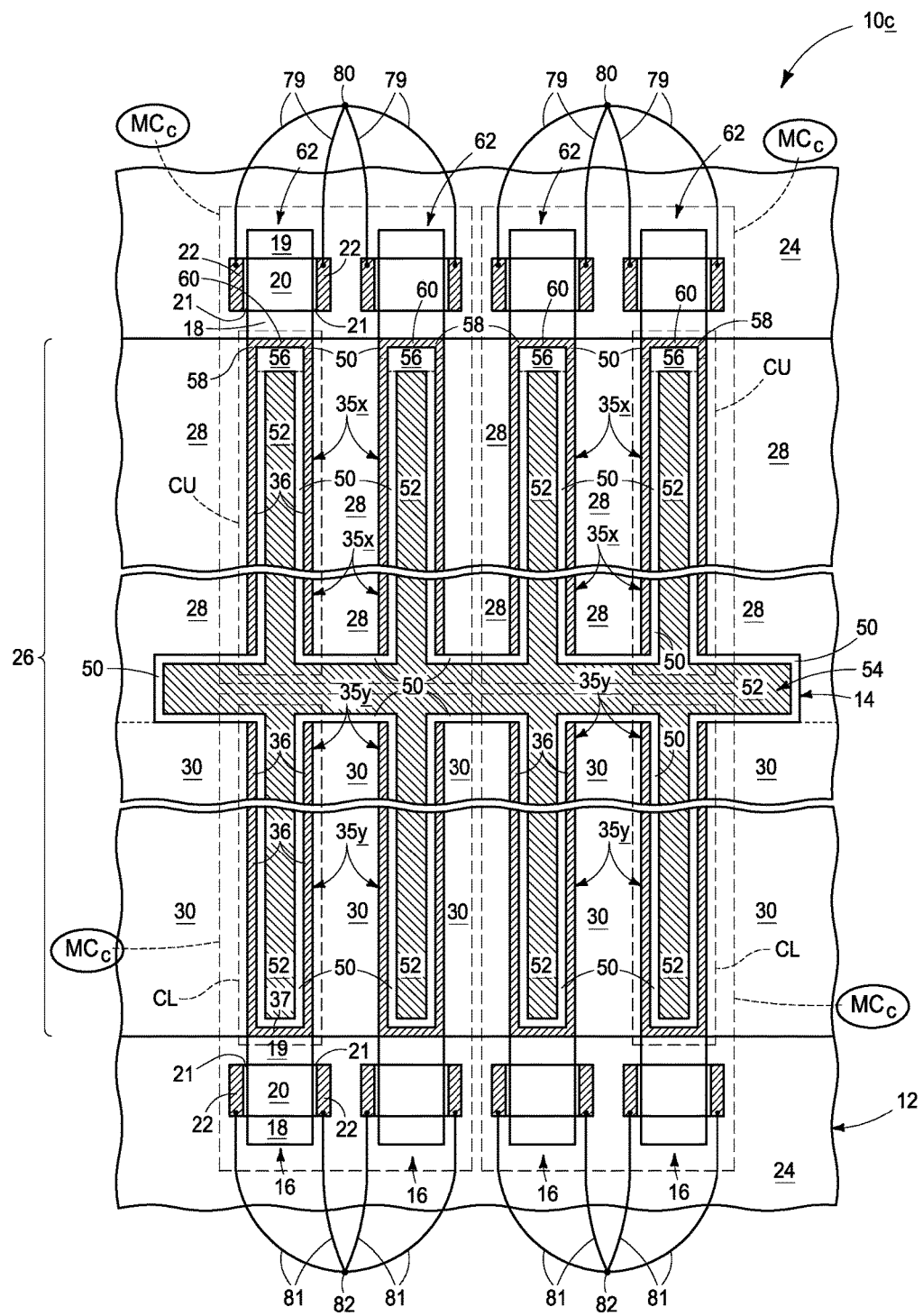
FIG. 27 is a hybrid schematic and diagrammatic cross-sectional view of a 2T/2C construction in accordance with an embodiment of the invention.

An alternate embodiment construction to that of FIG. 26 that may comprise 2T-2C architecture like that shown in FIG. 25 is shown in FIG. 27. Like numerals from the above-described embodiments have been used where appropriate, with some construction differences being indicated with the suffix "c" or different numerals. Construction 10c comprises individual memory cells $MC_c$ of 2T-2C architecture and which may be volatile or non-volatile depending on composition of the capacitor insulator. Construction 10c comprises a memory array having pairs of vertically opposed capacitors CU and CL, with the pairs individually comprising upper capacitor electrode lining 35x and lower capacitor electrode lining 35y that are elevationally separate and spaced from one another. The upper and lower capacitors are in two different memory cells $MC_c$ of the memory array. Shared capacitor electrode 54 is shared by the vertically opposed capacitors in individual of the pairs, with the shared capacitor electrode being laterally inward of and elevationally between the upper and lower capacitor electrode linings. Capacitor insulator 50 is between the shared capacitor electrode and the upper and lower capacitor electrode linings, with capacitor insulator 50 being directly against all top and bottom surfaces of the shared capacitor electrode. Upper transistors 62 are individually elevationally outward of and electrically coupled to one of the upper capacitor electrode linings. Pairs of immediately laterally adjacent of the upper transistors have their respective gates directly electrically coupled together to comprise one 2T-2C memory cell $MC_c$ of the array. Such is shown schematically in FIG. 27 by conductive interconnects 79 extending to a node 80 for the depicted two such individual pairs. Lower transistors 16 are individually elevationally inward of and electrically coupled to one of lower capacitor electrode linings 35y. Pairs of immediately laterally adjacent of the lower transistors having their respective gates directly electrically coupled together to comprise another 2T-2C memory cell $MC_c$ of the array. Such is shown schematically in FIG. 27 by conductive interconnects 81 extending to a node 82 for the depicted two such individual pairs. Construction (not shown) for interconnects 81 may be within and/or out of the plane of the page upon which FIG. 27 lies. In one embodiment, respective one source/drain regions of the immediately laterally adjacent of the upper transistors are electrically coupled to a respective one of two comparative bitlines that are electrically coupled to the same sense amplifier as described above with respect to FIG. 25. In one embodiment, respective one source/drain regions of the immediately laterally adjacent of the lower transistors are electrically coupled to a respective one of two comparative bitlines that are electrically coupled to the same sense amplifier as described above with respect to FIG. 25. Any other attribute(s) or aspect(s) as described herein and/or shown may be used.

Each of the above method and structure embodiments includes what might be considered or termed as a single deck, a single level, or a single tier of pairs of vertically opposed capacitors or horizontally nearby pairs. One of more additional deck(s)/level(s)/tier(s) may be provided above and/or below the described and depicted deck/level/tier. Further, additional circuitry (including perhaps one or more arrays of capacitors not in accordance with the invention) may be fabricated in one or more additional deck(s)/level(s)/tier(s) above and/or below the described and depicted deck/level/tier.

CONCLUSION

In some embodiments, a method of forming an array comprising pairs of vertically opposed capacitors comprises forming a conductive lining in individual capacitor openings in insulative-comprising material. An elevational mid-portion of individual of the conductive linings is removed to form an upper capacitor electrode lining and a lower capacitor electrode lining that are elevationally separate and spaced from one another in the individual capacitor openings. A capacitor insulator is formed laterally inward of the upper and lower capacitor electrode linings in the individual capacitor openings. Conductive material is formed laterally inward of the capacitor insulator in the individual capacitor openings and elevationally between the capacitor electrode linings. The conductive material is formed to comprise a shared capacitor electrode that is shared by vertically opposed capacitors in individual of the pairs of vertically opposed capacitors.

In some embodiments, a method of forming an array comprising pairs of vertically opposed capacitors comprises forming an upwardly-open conductive lining in individual capacitor openings. The capacitor openings extend through upper insulative material, into lower insulative material, and through sacrificial material elevationally there-between to a node location and to which individual of the conductive linings in the individual capacitor openings electrically couple. Covering material is formed over laterally-internal sidewalls of the conductive linings in the individual capacitor openings. The covering material covers at least a majority of those laterally-internal sidewalls that are laterally over each of the upper insulative material and the lower insulative material. After forming the covering material, both of the sacrificial material and an elevational mid-portion of the individual conductive linings that is elevationally between the upper and lower insulative materials in the individual capacitor openings are removed. The removing is conducted selectively relative to the covering material and the upper and lower insulative materials. The removing of the sacrificial material forms a void space elevationally between the upper and lower insulative materials laterally between the individual capacitor openings. An upper portion of the individual capacitor openings extends elevationally inward to the void space, a lower portion of the individual capacitor openings extends upward to the void space, and the removing of the elevational mid-portion of the individual conductive linings that is elevationally between the upper and lower insulative materials in the individual capacitor openings separates the individual conductive linings into an upper capacitor electrode lining and a lower capacitor electrode lining. A capacitor insulator is formed laterally inward of the upper and lower capacitor electrode linings in the individual capacitor openings and against walls of the void space to less-than-fill the void space and less-than-fill remaining volume of the upper and lower portions of the individual capacitor openings. Conductive material is formed laterally inward of the capacitor insulator in the individual capacitor openings and in the void space. The conductive material is formed to comprise a shared capacitor electrode that is shared by vertically opposed capacitors in individual of the pairs of vertically opposed capacitors and is shared by multiple of the pairs of vertically opposed capacitors.

In some embodiments, an array comprises pairs of vertically opposed capacitors, with the pairs individually comprising an upper capacitor electrode lining and a lower capacitor electrode lining that are elevationally separate and spaced from one another. A shared capacitor electrode is shared by the vertically opposed capacitors in individual of the pairs. The shared capacitor electrode is laterally inward of and elevationally between the upper and lower capacitor electrode linings. A capacitor insulator is between the shared capacitor electrode and the upper and lower capacitor electrode linings. The capacitor insulator is directly against all top and bottom surfaces of the shared capacitor electrode.

In some embodiments, an array comprises pairs of vertically opposed upper and lower capacitors, with the pairs individually comprising an upper capacitor electrode of the upper capacitor and a lower capacitor electrode of the lower capacitor that are elevationally separate and spaced from one another. A shared capacitor electrode is shared by the vertically opposed upper and lower capacitors in individual of the pairs. The shared capacitor electrode is laterally inward of and elevationally between the upper and lower capacitor electrodes. A capacitor insulator is between the shared capacitor electrode and the upper and lower capacitor electrodes. The upper capacitor electrode comprises conductive material of a downwardly-facing container shape comprising sidewalls and a top extending laterally to and between the sidewalls. The capacitor insulator is elevationally thicker between the top of the upper capacitor electrode and the shared capacitor electrode at its lateral center than it is laterally thick between the sidewalls of the upper capacitor electrode and the shared capacitor electrode.

In some embodiments, a memory array comprises pairs of vertically opposed capacitors. The pairs individually comprise an upper capacitor electrode lining and a lower capacitor electrode lining that are elevationally separate and spaced from one another. The capacitors in individual of the pairs individually are in two different memory cells of the memory array. A shared capacitor electrode is shared by the vertically opposed capacitors in individual of the pairs. The shared capacitor electrode is laterally inward of and elevationally between the upper and lower capacitor electrode linings. A capacitor insulator is between the shared capacitor electrode and the upper and lower capacitor electrode linings. The capacitor insulator is directly against all top and bottom surfaces of the shared capacitor electrode. Upper transistors are individually elevationally outward of and electrically coupled to one of the upper capacitor electrode linings to comprise one 1T-1C memory cell of the array. Lower transistors are individually elevationally inward of and electrically coupled to one of the lower capacitor electrode linings to comprise another 1T-1C memory cell of the array.

In some embodiments, a memory array comprises pairs of vertically opposed capacitors. The pairs of vertically opposed capacitors individually comprise an upper capacitor electrode lining and a lower capacitor electrode lining that are elevationally separate and spaced from one another. The capacitors in individual of the pairs of vertically opposed capacitors individually are in a same individual 2T-2C memory cell of the memory array. A shared capacitor electrode is shared by the vertically opposed capacitors in individual of the pairs of vertically opposed capacitors. The shared capacitor electrode is laterally inward of and elevationally between the upper and lower capacitor electrode linings. A capacitor insulator is between the shared capacitor electrode and the upper and lower capacitor electrode linings. The capacitor insulator is directly against all top and bottom surfaces of the shared capacitor electrode. Upper transistors are individually elevationally outward of and electrically coupled to one of the upper capacitor electrode linings. Lower transistors are individually elevationally inward of and electrically coupled to one of the lower capacitor electrode linings. Pairs of one of the upper transistors and one of the lower transistors have their respective gates directly electrically coupled together to comprise the individual 2T-2C memory cells of the memory array.

In some embodiments, a memory array comprises pairs of vertically opposed capacitors. The pairs of vertically opposed capacitors individually comprise an upper capacitor electrode lining and a lower capacitor electrode lining that are elevationally separate and spaced from one another. The capacitors in individual of the pairs of vertically opposed capacitors individually are in two different memory cells of the memory array. A shared capacitor electrode is shared by the vertically opposed capacitors in individual of the pairs of vertically opposed capacitors. The shared capacitor electrode is laterally inward of and elevationally between the upper and lower capacitor electrode linings. A capacitor insulator is between the shared capacitor electrode and the upper and lower capacitor electrode linings. The capacitor insulator is directly against all top and bottom surfaces of the shared capacitor electrode. Upper transistors are individually elevationally outward of and electrically coupled to one of the upper capacitor electrode linings. Pairs of immediately laterally adjacent of the upper transistors have their respective gates directly electrically coupled together to comprise one 2T-2C memory cell of the array. Lower transistors are individually elevationally inward of and electrically coupled to one of the lower capacitor electrode linings. Pairs of immediately laterally adjacent of the lower transistors have their respective gates directly electrically coupled together to comprise another 2T-2C memory cell of the array.

In some embodiments, a memory array comprises pairs of vertically opposed upper and lower capacitors. The pairs individually comprise an upper capacitor electrode of the upper capacitor and a lower capacitor electrode of the lower capacitor that are elevationally separate and spaced from one another. The upper and lower capacitors in individual of the pairs individually are in two different memory cells of the memory array. A shared capacitor electrode is shared by the vertically opposed upper and lower capacitors in individual of the pairs. The shared capacitor electrode is laterally inward of and elevationally between the upper and lower capacitor electrodes. A capacitor insulator is between the shared capacitor electrode and the upper and lower capacitor electrodes. The upper capacitor electrode comprises conductive material of a downwardly-facing container shape comprising sidewalls and a top extending laterally to and between the sidewalls. The capacitor insulator is elevationally thicker between the top of the upper capacitor electrode and the shared capacitor electrode at its lateral center than it is laterally thick between the sidewalls of the upper capacitor electrode and the shared capacitor electrode. Upper transistors are individually elevationally outward of and electrically coupled to one of the upper capacitor electrode linings to comprise one 1T-1C memory cell of the array. Lower transistors are individually elevationally inward of and electrically coupled to one of the lower capacitor electrode linings to comprise another 1T-1C memory cell of the array.

In some embodiments, a memory array comprises pairs of vertically opposed upper and lower capacitors. The pairs of vertically opposed upper and lower capacitors individually comprise an upper capacitor electrode of the upper capacitor and a lower capacitor electrode of the lower capacitor that are elevationally separate and spaced from one another. The upper and lower capacitors in individual of the pairs of vertically opposed upper and lower capacitors are in a same individual 2T-2C memory cell of the memory array. A shared capacitor electrode is shared by the vertically opposed upper and lower capacitors in individual of the pairs of vertically opposed upper and lower capacitors. The shared capacitor electrode is laterally inward of and elevationally between the upper and lower capacitor electrodes. A capacitor insulator is between the shared capacitor electrode and the upper and lower capacitor electrodes. The upper capacitor electrode comprises conductive material of a downwardly-facing container shape comprising sidewalls and a top extending laterally to and between the sidewalls. The capacitor insulator is elevationally thicker between the top of the upper capacitor electrode and the shared capacitor electrode at its lateral center than it is laterally thick between the sidewalls of the upper capacitor electrode and the shared capacitor electrode. Upper transistors are individually elevationally outward of and electrically coupled to one of the upper capacitor electrode linings. Lower transistors are individually elevationally inward of and electrically coupled to one of the lower capacitor electrode linings. Pairs of one of the upper transistors and one of the lower transistors have their respective gates directly electrically coupled together to comprise the individual 2T-2C memory cells of the memory array.

In some embodiments, a memory array comprises pairs of vertically opposed upper and lower capacitors. The pairs of vertically opposed upper and lower capacitors individually comprise an upper capacitor electrode of the upper capacitor and a lower capacitor electrode of the lower capacitor that are elevationally separate and spaced from one another. The upper and lower capacitors are in two different memory cells of the memory array. A shared capacitor electrode is shared by the vertically opposed upper and lower capacitors in individual of the pairs of vertically opposed upper and lower capacitors. The shared capacitor electrode is laterally inward of and elevationally between the upper and lower capacitor electrodes. A capacitor insulator is between the shared capacitor electrode and the upper and lower capacitor electrodes. The upper capacitor electrode comprises conductive material of a downwardly-facing container shape comprising sidewalls and a top extending laterally to and between the sidewalls. The capacitor insulator is elevationally thicker between the top of the upper capacitor electrode and the shared capacitor electrode at its lateral center than it is laterally thick between the sidewalls of the upper capacitor electrode and the shared capacitor electrode. Upper transistors are individually elevationally outward of and electrically coupled to one of the upper capacitor electrode linings. Pairs of immediately laterally adjacent of the upper transistors have their respective gates directly electrically coupled together to comprise one 2T-2C memory cell of the array. Lower transistors are individually elevationally inward of and electrically coupled to one of the lower capacitor electrode linings. Pairs of immediately laterally adjacent of the lower transistors have their respective gates directly electrically coupled together to comprise another 2T-2C memory cell of the array.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an array comprising pairs of vertically opposed capacitors, comprising:
   forming a conductive lining in individual capacitor openings in insulative-comprising material;
   removing an elevational mid-portion of individual of the conductive linings to form an upper capacitor electrode lining and a lower capacitor electrode lining that are elevationally separate and spaced from one another in the individual capacitor openings;

forming a capacitor insulator laterally inward of the upper and lower capacitor electrode linings in the individual capacitor openings; and forming conductive material laterally inward of the capacitor insulator in the individual capacitor openings and elevationally between the capacitor electrode linings to comprise a shared capacitor electrode that is shared by vertically opposed capacitors in individual of the pairs of vertically opposed capacitors.

2. The method of claim 1 comprising forming the shared capacitor electrode to also be shared by multiple of the pairs of vertically opposed capacitors.

3. The method of claim 1 wherein the conductive lining in the individual capacitor openings comprises a container shape comprising sidewalls and a bottom extending laterally to and between the sidewalls.

4. The method of claim 1 comprising forming the conductive lining to be upwardly open.

5. The method of claim 1 comprising forming the conductive lining, the upper capacitor electrode lining, and the lower capacitor electrode lining to be totally encircling in the individual capacitor openings in horizontal cross-section.

6. The method of claim 1 comprising forming the upper capacitor electrode lining to comprise a downwardly-facing container shape comprising sidewalls and a top extending laterally to and between the sidewalls.

7. The method of claim 6 wherein the capacitor insulator is elevationally thicker between the top of the upper capacitor electrode lining and the shared capacitor electrode at its lateral center than it is laterally thick between the sidewalls of the upper capacitor electrode lining and the shared capacitor electrode.

8. The method of claim 1 wherein the removing comprises etching the elevational mid-portion of the conductive linings starting from a laterally-outer side of the elevational mid-portions of the conductive linings.

9. The method of claim 1 wherein the removing comprises etching the elevational mid-portion of the conductive linings starting from a laterally-inner side of the elevational mid-portions of the conductive linings.

10. The method of claim 1 wherein, during the removing, covering material is over at least a majority of laterally-internal sidewalls of the conductive linings except for laterally-internal sidewalls of the mid-portions during the removing.

11. The method of claim 10 comprising removing all remaining of said covering material prior to forming the conductive material of the shared capacitor electrode.

12. The method of claim 1 wherein the capacitor insulator comprises programmable material such that the capacitors are non-volatile and programmable into at least two different magnitude capacitive states.

13. The method of claim 1 wherein the capacitor insulator comprises dielectric material such that the capacitors are volatile.

14. The method of claim 1 wherein the insulative-comprising material comprises an upper insulative material, a lower insulative material, and sacrificial material elevationally there-between; and further comprising:
removing the sacrificial material to form a void space elevationally between the upper and lower insulative materials laterally between the individual capacitor openings and into which the capacitor insulator and the conductive material are formed.

15. The method of claim 14 wherein the sacrificial material is not dielectric.

16. The method of claim 15 wherein the sacrificial material is predominately elemental-form silicon.

17. The method of claim 14 wherein the sacrificial material is dielectric.

18. The method of claim 14 comprising removing the sacrificial material to form the void space before removing the elevational mid-portions of the individual conductive linings.

19. The method of claim 14 comprising removing the sacrificial material to form the void space after removing the elevational mid-portions of the individual conductive linings.

20. The method of claim 1 wherein the capacitor insulator is directly against all top and bottom surfaces of the shared capacitor electrode.

21. The method of claim 20 wherein the capacitor insulator is directly against all sidewall edge surfaces of the shared capacitor electrode.

22. The method of claim 1 comprising forming the vertically opposed capacitors to individually comprise part of an individual memory cell.

23. The method of claim 22 comprising:
forming transistors that ultimately are below the lower capacitor electrode linings that individually have a source/drain region thereof electrically coupled to individual of the lower capacitor electrode linings; and
forming transistors that ultimately are above the upper capacitor electrode linings that individually have a source/drain region thereof electrically coupled to individual of the upper capacitor electrode linings.

24. The method of claim 23 comprising:
forming the transistors that are below the lower capacitor electrode linings to be lower elevationally-extending transistors, the source/drain region of the respective lower elevationally-extending transistor being electrically coupled to individual of the lower capacitor electrode linings; and
forming the transistors that are above the upper capacitor electrode linings to be upper elevationally-extending transistors, the source/drain region of the respective upper elevationally-extending transistor being electrically coupled to individual of the upper capacitor electrode linings.

25. The method of claim 24 comprising forming the upper and lower elevationally-extending transistors to be vertical transistors.

26. A method of forming an array comprising pairs of vertically opposed capacitors, comprising:
forming an upwardly-open conductive lining in individual capacitor openings, the capacitor openings extending through upper insulative material, into lower insulative material, and through sacrificial material elevationally there-between to a node location and to which individual of the conductive linings in the individual capacitor openings electrically couple;
forming covering material over laterally-internal sidewalls of the conductive linings in the individual capacitor openings, the covering material covering at least a majority of those laterally-internal sidewalls that are laterally over each of the upper insulative material and the lower insulative material;
after forming the covering material, removing both of the sacrificial material and an elevational mid-portion of the individual conductive linings that is elevationally between the upper and lower insulative materials in the individual capacitor openings, the removing being conducted selectively relative to the covering material and the upper and lower insulative materials, the removing of the sacrificial material forming a void space elevationally between the upper and lower insulative materials laterally between the individual capacitor openings, an upper portion of the individual capacitor openings extending elevationally inward to the void space, a lower portion of the individual capacitor openings extending upward to the void space, the removing of the elevational mid-portion of the individual conductive linings that is elevationally between the upper and lower insulative materials in the individual capacitor openings separating the individual conductive linings into an upper capacitor electrode lining and a lower capacitor electrode lining;

forming a capacitor insulator laterally inward of the upper and lower capacitor electrode linings in the individual capacitor openings and against walls of the void space to less-than-fill the void space and less-than-fill remaining volume of the upper and lower portions of the individual capacitor openings; and forming conductive material laterally inward of the capacitor insulator in the individual capacitor openings and in the void space to comprise a shared capacitor electrode that is shared by vertically opposed capacitors in individual of the pairs of vertically opposed capacitors and is shared by multiple of the pairs of vertically opposed capacitors.

27. The method of claim 26 wherein the removing comprises removing at least a majority of the sacrificial material before removing the mid-portion of the individual conductive linings that is elevationally between the upper and lower insulative materials in the individual capacitor openings.

28. The method of claim 26 wherein the removing comprises removing the mid-portion of the individual conductive linings that is elevationally between the upper and lower insulative materials in the individual capacitor openings before removing at least a majority of the sacrificial material.

\* \* \* \* \*